US006596147B2

(12) United States Patent
Hill et al.

(10) Patent No.: US 6,596,147 B2
(45) Date of Patent: Jul. 22, 2003

(54) METHODS OF OVERPLATING SURFACES OF MICROELECTROMECHANICAL STRUCTURE

(75) Inventors: Edward Hill, Chapel Hill, NC (US); Robert L. Wood, Cary, NC (US); Ramaswamy Mahadevan, Chapel Hill, NC (US)

(73) Assignee: Memscap S.A., Crolles Cedex (FR)

( * ) Notice: Subject to any disclaimer, the term of this patent is extended or adjusted under 35 U.S.C. 154(b) by 94 days.

(21) Appl. No.: 09/809,538

(22) Filed: Mar. 15, 2001

(65) Prior Publication Data

US 2001/0050232 A1 Dec. 13, 2001

Related U.S. Application Data

(62) Division of application No. 09/261,483, filed on Feb. 26, 1999, now Pat. No. 6,236,139.

(51) Int. Cl.[7] ................................................. C25D 5/02
(52) U.S. Cl. ........................ 205/82; 205/84; 205/118; 205/122; 205/131; 205/149
(58) Field of Search .................. 205/118, 122, 205/135, 82, 84, 131, 149

(56) References Cited

U.S. PATENT DOCUMENTS

| 1,258,368 A | 3/1918 | Smith .......................... 310/307 |
| 1,658,669 A | 2/1928 | Cohn et al. .................. 310/307 |

(List continued on next page.)

FOREIGN PATENT DOCUMENTS

| DE | 38 09 597 | 10/1989 |
| EP | 0 469 749 | 2/1992 |

(List continued on next page.)

OTHER PUBLICATIONS

Klaassen E H et al: "Silicon Fusion Bonding And Deep Reactive Ion Etching: A New Technology For Microstructures" *Sensors and Actuators A*, vol. 52, No. 1/03, Mar. 1996, pp. 132–139.

(List continued on next page.)

*Primary Examiner*—Roy King
*Assistant Examiner*—William T. Leader
(74) *Attorney, Agent, or Firm*—Myers Bigel Sibley & Sajovec

(57) ABSTRACT

MEMS structures are provided that compensate for ambient temperature changes, process variations, and the like, and can be employed in many applications. These structures include an active microactuator adapted for thermal actuation to move in response to the active alteration of its temperature. The active microactuator may be further adapted to move in response to ambient temperature changes. These structures also include a temperature compensation element, such as a temperature compensation microactuator or frame, adapted to move in response to ambient temperature changes. The active microactuator and the temperature compensation element move cooperatively in response to ambient temperature changes. Thus, a predefined spatial relationship is maintained between the active microactuator and the associated temperature compensation microactuator over a broad range of ambient temperatures absent active alteration of the temperature of the active microactuator. In an alternative embodiment wherein the active microactuator is suspended within a frame above the substrate, the MEMS structure holds at least a portion of the active microactuator in a fixed position relative to the substrate over a broad range of ambient temperatures absent active alteration of the temperature of the active microactuator. By actively altering the temperature of the active microactuator, the active microactuator can be controllably moved relative to the temperature compensation microactuator and/or the underlying substrate. Related methods of compensating for the effects of ambient temperature variations are provided. Further, an overplating technique is provided for precisely sizing a gap defined within a MEMS structure.

14 Claims, 12 Drawing Sheets

U.S. PATENT DOCUMENTS

| | | | | |
|---|---|---|---|---|
| 3,213,318 A | | 10/1965 | Glenn | 310/307 |
| 3,609,593 A | | 9/1971 | Bell et al. | 331/156 |
| 4,806,815 A | | 2/1989 | Honna | 310/307 |
| 5,179,499 A | | 1/1993 | MacDonald et al. | 361/313 |
| 5,184,269 A | | 2/1993 | Shimada et al. | 361/24 |
| 5,190,637 A | * | 3/1993 | Guckel | 205/118 |
| 5,261,747 A | | 11/1993 | Deacutis et al. | 374/137 |
| 5,309,056 A | | 5/1994 | Culp | 310/306 |
| 5,344,117 A | | 9/1994 | Trah et al. | 251/11 |
| 5,355,712 A | | 10/1994 | Peterson et al. | 73/4 R |
| 5,367,584 A | | 11/1994 | Ghezzo et al. | 385/17 |
| 5,441,343 A | | 8/1995 | Pylkki et al. | 374/137 |
| 5,467,068 A | | 11/1995 | Field et al. | 335/4 |
| 5,475,318 A | | 12/1995 | Marcus et al. | 324/762 |
| 5,483,799 A | | 1/1996 | Dalto | 62/3.7 |
| 5,512,162 A | * | 4/1996 | Sachs et al. | 205/91 |
| 5,536,988 A | | 7/1996 | Zhang et al. | 310/309 |
| 5,558,304 A | | 9/1996 | Adams | 244/134 A |
| 5,600,174 A | | 2/1997 | Reay et al. | 257/467 |
| 5,602,955 A | | 2/1997 | Haake | 385/136 |
| 5,606,635 A | | 2/1997 | Haake | 385/53 |
| 5,629,665 A | | 5/1997 | Kaufmann et al. | 338/18 |
| 5,644,177 A | | 7/1997 | Guckel et al. | 310/40 MM |
| 5,659,285 A | | 8/1997 | Takeda | 337/389 |
| 5,722,989 A | | 3/1998 | Fitch et al. | 606/205 |
| 5,796,152 A | | 8/1998 | Carr et al. | 257/415 |
| 5,813,441 A | | 9/1998 | Dewispelaere | 139/455 |
| 5,862,003 A | | 1/1999 | Saif et al. | 359/871 |
| 5,881,198 A | | 3/1999 | Haake | 385/136 |
| 5,909,078 A | | 6/1999 | Wood et al. | 310/307 |
| 5,955,817 A | | 9/1999 | Dhuler et al. | 310/307 |
| 5,962,949 A | | 10/1999 | Dhuler et al. | 310/307 |
| 5,972,193 A | * | 10/1999 | Chou et al. | 205/122 |
| 6,012,335 A | * | 1/2000 | Bashir et al. | 73/632 |
| 6,174,416 B1 | * | 1/2001 | Magenau et al. | 204/192.12 |
| 6,261,494 B1 | * | 7/2001 | Zavracky et al. | 205/122 |

FOREIGN PATENT DOCUMENTS

| | | |
|---|---|---|
| EP | 0 478 956 | 4/1992 |
| EP | 0 655 590 | 8/1995 |
| FR | 764821 | 5/1934 |
| FR | 2 326 795 | 9/1976 |
| GB | 792145 | 3/1958 |
| WO | WO 98/19320 | 5/1998 |

OTHER PUBLICATIONS

Phipps, Thesis: *Design And Development Of Microswitches For Micro–Electro–Mechanical Relay Matrices*, Air Force Inst. of Tech., Wright–Patterson AFB, OH School of Engineering, Aug. 1995.

Yamagata, et al.,*A Micro Mobile Mechanism Using Thermal Expansion And Its Theoretical Analysis—A Comparison With Impact Drive MEchanism Using Piezoelectric Elements*, Proceedings of the IEEE Micro Electro Mechanical Systems, Jan. 1994, pp. 142–147.

Oh, et al., *Thin Film Heater On A Thermally Isolated Microstructure*, Smart Materials Fabrication and Materials for Micro–Electro–Mechanical Systems, Dec. 1992, pp. 277–282.

Safranek, *The Properties Of Electrodeposited Metals & Alloys*, Amer. Electroplaters & Surface Finishers Society, Dec. 1986, pp. 295–315.

Klassen, et al., *Silicon Fusion Bonding And Deep Reactive Ion Etching; A New Technology For Microstructures*, Transducers '95—Eurosensors IX, The 8th International Conference On Solid State Sensors And Actuators, and Eurosensors IX, Stockholm, Sweden, Jun. 25–29, 1995, pp. 556–559.

Noworolski, et al., *Fabrication Of SOI Wafers With Buried Cavities Using Silicon Fusion Bonding And Electrochemical Etchback*, Transducers '95—Eurosensors IX, The 8th International Conference On Solid State Sensors And Actuators, and Eurosensors IX, Stockholm, Sweden, Jun. 25–29, 1995, pp. 71–74.

*Single Crystal Silicon Actuators And Sensors Based On Silicon Fusion Bonding Technology*, Semiannual Progress Report 1, Advanced Research Projects Agency, Lucas NovaSensor, Contract No. DAAL 01–94–C–3411, Apr.–Jul 1994.

*Single Crystal Silicon Actuators And Sensors Based On Silicon Fusion Bonding Technology*, Semiannual Progress Report 2, Advanced Research Projects Agency, Lucas NovaSensor, Contract No. DAAL 01–94–C–3411, Jul 1994–Jan. 1995.

*Single Crystal Silicon Actuators And Sensors Based On Silicon Fusion Bonding Technology*, Semiannual Progress Report, Advanced Research Projects Agency, Lucas NovaSensor, Contract No. DAAL 01–94–C–3411, Jan.–Jul. 1995.

*Single Crystal Silicon Actuators And Sensors Based On Silicon Fusion Bonding Technology*, Semiannual Progress Report, Advanced Research Projects Agency, Lucas NovaSensor, Contract No. DAAL 01–94–C–3411, Jan.–Aug. 1996.

J.W. Judy et al., *Surface Micromachined Linear Thermal Microactuator*, International Electron Devices Meeting 1990. Technical Digest (CAT. No. 90CH2865–4, Dec. 1990, New York, New York, pp. 629–632.

Fedder et al., *Multimode Digital Control of a Suspended Polysilicon Microstructure*, Journal of Microelectromechanical Systems, Dec. 1986, vol. 5, No. 4, pp. 283–297.

Comtois et al., *Applications for Surface–Micromachined Polysilicon Thermal Actuators and Arrays*, Sensors and Actuators, Jan. 1997, vol. 58, No. 1, pp. 19–25.

Lin et al., *Vertically Driven Microactuators by Electrothermal Buckling Effects*, Sensors and Actuators, Nov. 1998, vol. 17, Nos. 1–2, pp. 35–39.

International Search Report, PCT/US00/04389, Jul. 3, 2000.

* cited by examiner

METHODS OF OVERPLATING SURFACES OF MICROELECTROMECHANICAL STRUCTURE

CLAIM FOR PRIORITY AND CROSS-REFERENCE TO OTHER APPLICATIONS

This application claims priority to and is a divisional of parent application Ser. No. 09/261,483 filed, Feb. 26, 1999, now U.S. Pat. No. 6,236,139 B1 the disclosure of which is hereby incorporated herein by reference.

FIELD OF THE INVENTION

The present invention relates to microelectromechanical structures, and more particularly to temperature compensated thermally actuated microelectromechanical structures and associated methods.

BACKGROUND OF THE INVENTION

Microelectromechanical structures (MEMS) and other microengineered devices are presently being developed for a wide variety of applications in view of the size, cost and reliability advantages provided by these devices. Many different varieties of MEMS devices have been created, including microgears, micromotors, and other micromachined devices that are capable of motion or applying force. These MEMS devices can be employed in a variety of applications including but not limited to hydraulic applications in which MEMS pumps or valves are utilized and optical applications which include MEMS light valves and shutters.

MEMS devices have relied upon various techniques to provide the force necessary to cause the desired motion within these microstructures. For example, cantilevers have been employed to apply mechanical force in order to rotate micromachined springs and gears. In addition, some micromotors are driven by electromagnetic fields, while other micromachined structures are activated by piezoelectric or electrostatic forces. Recently, MEMS devices that are actuated by the controlled thermal expansion of an actuator or other MEMS component have been developed. For example, U.S. patent application Ser. Nos. 08/767,192; 08/936,598, and 08/965,277 which are assigned to MCNC, the assignee of the present invention, describe various types of thermally actuated MEMS devices. The contents of each of these applications are hereby incorporated by reference herein. Thermal actuators as described in these applications comprise arched beams formed from silicon or metallic materials that further arch or otherwise deflect when heated, thereby creating motive force. These applications also describe various types of direct and indirect heating mechanisms for heating the beams to cause further arching, such that the thermal actuator structures move relative to other microelectronic structures when thermally actuated.

In practically every application of MEMS devices, precisely controlled and reliable movement is required. Given the micron scale dimensions associated with MEMS structures, stable and predictable movement characteristics are critically important. The movement characteristics of MEMS devices can be affected by intrinsic factors, such as the type of materials used to fabricate the MEMS device, the dimensions and structure of the MEMS device, and the effects of semiconductor process variations. All of these intrinsic factors can be controlled to some extent by the MEMS design engineer. In addition, movement characteristics may be affected by extrinsic factors such as fluctuations in the ambient temperature in which the MEMS device operates, which cannot be controlled by the MEMS design engineer. While all of the above factors affect the ability of a MEMS device to move precisely and predictably, the impact of these factors may vary from device to device. For instance, while thermally actuated MEMS devices are affected by all the above factors, they are particularly sensitive to ambient operating temperature variations because they are thermally driven devices.

More particularly, a thermally actuated MEMS device may operate unpredictably or erroneously since the MEMS device will move not only in response to thermal actuation caused by active heating or cooling, but also due to changes in the ambient operating temperature. If ambient temperatures are very high, parts of a MEMS device designed to move in response to thermal actuation may move too much or too far. Alternatively, in very low ambient temperatures, parts of a thermally actuated MEMS device designed to move may not move sufficiently in response to thermal actuation thereof. In either temperature extreme, maintaining parts of MEMS device in predictable positions relative to each other can be difficult. Ambient temperature effects can thus affect the reliability and limit the possible applications of MEMS thermally actuated devices. Those skilled in the art will appreciate that similar problems can arise due to residual stress created by semiconductor process variations and structural differences within MEMS devices.

Therefore, while some thermally activated MEMS structures have been developed, it would still be advantageous to develop other types of thermally actuated structures that would operate more reliably or more precisely even when exposed to significant ambient temperature fluctuations. Consequently, these MEMS structures would be suitable for a wider variety of applications. Numerous applications including but not limited to switches, relays, variable capacitors, variable resistors, valves, pumps, optical mirror arrays, and electromagnetic attenuators would be better served by MEMS structures with these attributes.

SUMMARY OF THE INVENTION

The present invention provides temperature compensated microelectromechanical structures and related methods that satisfy at least some of the above needs and provide several advantageous features. According to the present invention, the temperature compensated MEMS structures include an active microactuator and a temperature compensation element such as a temperature compensation microactuator or a frame. The active microactuator and the respective temperature compensation elements are adapted to move in unison in response to thermal actuation caused by ambient temperature changes. However, the active microactuator is also adapted to move in response to the active alteration of the temperature of the active microactuator, such as in response to active heating of the active microactuator. Since the active microactuator and the respective temperature compensation element are adapted to move cooperatively in response to changes in ambient temperature, a predefined spatial or positional relationship can be substantially maintained over a range of ambient temperatures in the absence of active alteration of the temperature of the active microactuator. For example, a predefined spatial relationship can be maintained between the active and temperature compensation microactuators as the ambient temperature changes. In an alternative embodiment that includes a frame, a portion of the active microactuator can be maintained in the same relative position with respect to an underlying microelectronic substrate as the ambient temperature changes.

Accordingly, the temperature compensated microelectromechanical structures of the present invention can isolate the movement of the active microactuator that is driven by active alteration of the temperature of the active microactuator from that which is caused by changes in ambient temperature. As such, the temperature compensated microelectromechanical structures of the present invention can operate more precisely than conventional microelectromechanical structures since the effects of ambient temperature changes are eliminated.

In one embodiment, the temperature compensated microelectromechanical structure includes a microelectronic substrate having a first major surface, an active microactuator, and a temperature compensation microactuator. While the temperature compensated microelectromechanical structure can include a variety of types of actuators, the active microactuator and the temperature compensation microactuator are preferably thermal arched beam actuators. Regardless of the type of actuator, the temperature compensation microactuator is disposed upon the first major surface of the microelectronic substrate and adapted for thermal actuation. In particular, the temperature compensation microactuator is adapted to controllably move in response to changes in ambient temperature. Similarly, the active microactuator is disposed upon the first major surface of the microelectronic substrate and adapted thermal actuation. In contrast to the temperature compensation microactuator, however, the active microactuator is adapted to controllably move in response to the cumulative effect of changes in ambient temperature and active alteration of the temperature of the active microactuator. Accordingly, both microactuators are adapted to move in unison in response to changes in ambient temperature so as to compensate for the effects of ambient temperature changes. In particular, the active and temperature compensation microactuators are adapted to move and maintain a predefined spatial relationship relative to each other over a range of ambient temperatures, in the absence of active alteration of the temperature of the microactuators.

In one embodiment, the temperature compensation microactuator comprises a first member and the active microactuator comprises a second member, with each member adapted to move with the respective microactuator. The first and second members can be selectively brought into contact with each other in response to the active alteration of the temperature of the active microactuator, such that the temperature compensation structure of this embodiment can serve as a relay, a switch or the like. As a result of its unique construction, however, the first and second members will not be brought into contact merely by changes in the ambient temperature since both the temperature compensation microactuator and the active microactuator will move cooperatively in equal amounts. The temperature compensation structure of this embodiment can also include a spring adapted to flex and absorb mechanical stresses as the first member and second member are selectively brought into contact.

In a further embodiment, the active and temperature compensation microactuators can include complimentary male and female electrical contacts. The electrical contacts are adapted to move with the corresponding microactuator and are selectively brought into contact with each other in response to the active alteration of the temperature of the active microactuator. In another embodiment, the active microactuator comprises at least one shorting electrical contact, and the temperature compensation microactuator comprises at least two electrically disconnected electrical contacts. In response to active alteration of the temperature of the active microactuator, the shorting electrical contact is moved so as to selectively electrically connect the electrical contacts carried by the temperature compensation microactuator.

Another embodiment of the temperature compensated microelectromechanical structure comprises a microelectronic substrate having a first major surface, a frame disposed upon the first major surface, and an active microactuator also disposed upon the first major surface. The active microactuator is also operably connected to the frame and, in some embodiments, may be disposed within or surrounded by the frame. The frame is adapted for thermal actuation so as to move in response to changes in ambient temperature. In contrast, the active microactuator is adapted to move in response to active alteration of the temperature of the active microactuator. The frame and active microactuator are adapted to move cooperatively in response to changes in ambient temperature such that at least a portion of the active microactuator is maintained in substantially the same relative position with respect to the microelectronic substrate as the ambient temperature changes so long as the temperature of the active microactuator is not actively altered.

The various embodiments of the temperature compensated microelectromechanical structures can be employed in a variety of applications. For instance, the temperature compensated microelectromechanical structures can serve as switches, relays, variable capacitors, and variable resistors. The temperature compensated microelectromechanical structures can also serve as valves, moveable mirrors with or without latches, and electromagnetic radiation attenuators. In addition, the present invention provides related compensation methods for counteracting the effects of ambient temperature variations within microelectromechanical structures.

Regardless of the application, the temperature compensated microelectromechanical structures of the present invention can isolate the movement of the active microactuator that is driven by active alteration of the temperature of the active microactuator from that which is caused by changes in ambient temperature. As such, the temperature compensated microelectromechanical structures of the present invention operate more precisely and predictably than conventional microelectromechanical structures by eliminating the adverse effects of ambient temperature changes.

In order to more precisely define the size of the gap that is part of a MEMS structure, a method of overplating selected surfaces of a MEMS structure is also provided according to the present invention. In this regard, a MEMS structure that defines a gap, such as the contact separation gap between a pair of contacts of a MEMS relay or switch or the separation gap between the conductive plates of a MEMS capacitor, is placed in a plating bath that includes a plating material. Typically, the plating material is a conductive material, such as gold, rhodium, silver, rhuthenium, palladium, or alloys thereof. In addition, other elements or alloys thereof used by those skilled in the art to form electrical contacts may be used as the plating material. Thereafter, the plating material is electroplated onto at least those portions of the MEMS structure that define the gap. By controlling the electroplating process, the resulting gap defined by the overplated portions of the MEMS structure has a predefined size. According to this embodiment, for example, the electroplating process can be controlled such that the resulting gap can be defined to within approximately 0.5 microns, thereby producing a MEMS structure having increased performance characteristics relative to conventional MEMS structures.

Although the foregoing invention will be described in some detail, it will be obvious that certain changes and modifications may be practiced within the scope of the invention described herein.

DETAILED DESCRIPTION OF THE INVENTION

Figure 1:
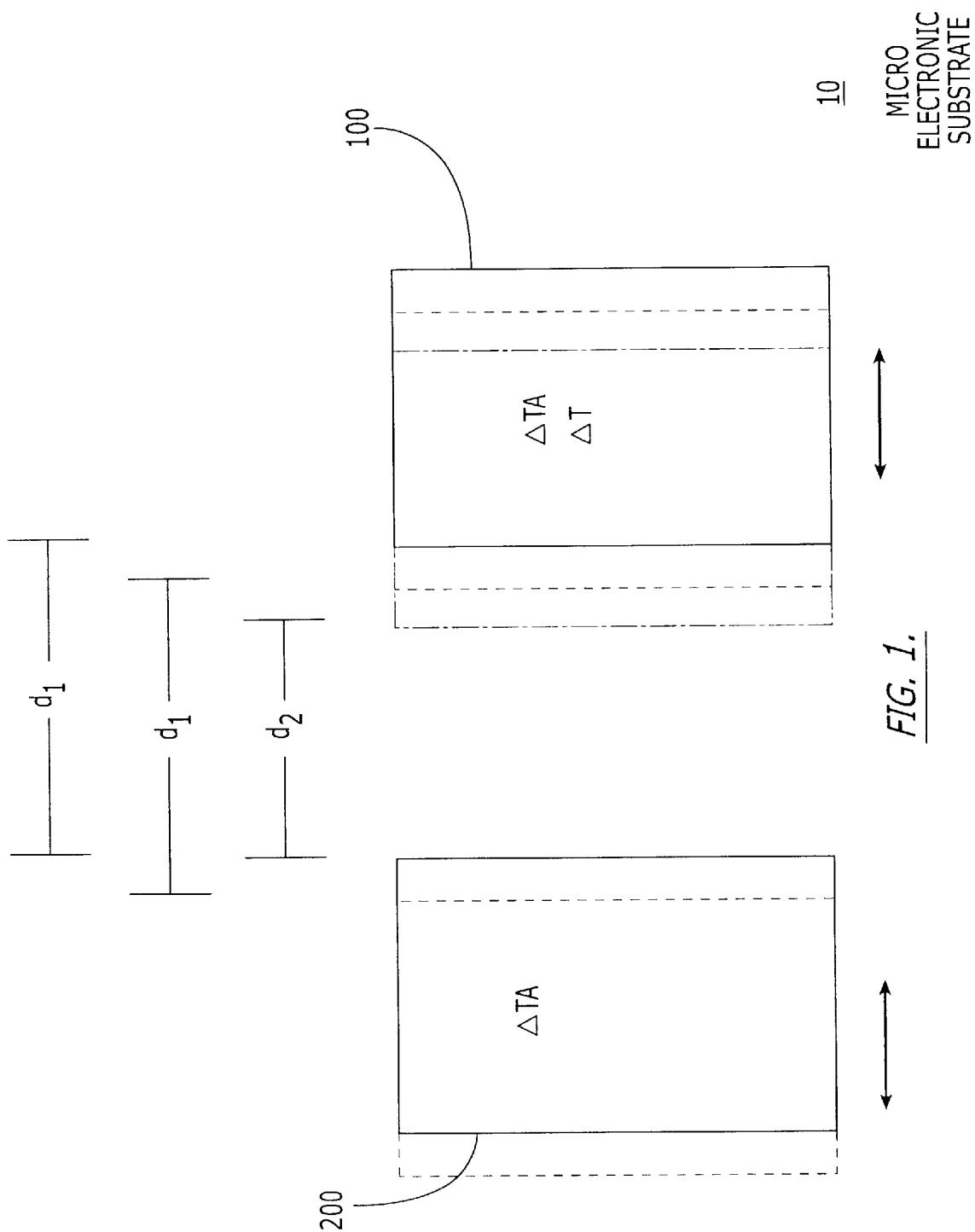
FIG. 1 provides a schematic plan view of a temperature compensated MEMS structure according to one embodiment of the present invention illustrating various positions of the active and temperature compensation microactuators.

The present invention will now be described more fully hereinafter with reference to the accompanying drawings, in which preferred embodiments of the present invention are shown. The present invention may, however, be embodied in many different forms and should not be construed as limited to the embodiments set forth herein; rather, these embodiments are provided so that this disclosure will be thorough and complete, and will fully convey the scope of the present invention to those skilled in the art. Features in the drawings are not necessarily to scale, but merely serve to illustrate the present invention. Like numbers refer to like elements throughout.

The present invention provides microelectromechanical structures and related methods that are adapted to compensate for the effects of ambient temperature changes, residual stress caused by process variations, and the like in order to provide more predictable and precise movement. These MEMS structures include an active microactuator adapted for thermal actuation. When complimentary microactuators are used within the MEMS structure, the active microactuator is adapted to move in response to the cumulative effect of ambient temperature variations and the active alteration of the temperature of the active microactuator, such as caused by the active heating of the active microactuator. When a frame and active microactuator are used within the MEMS structure, the active microactuator is adapted to move in response to the active alteration of the temperature of the active microactuator, such as caused by the active heating of the active microactuator. Further, these structures include a temperature compensation element, such as a temperature compensation microactuator or a frame. Although not generally actively heated or cooled, the temperature compensation element is adapted to move in response to changes in ambient temperature in order to compensate therefor. According to the present invention, the active microactuator and the respective temperature compensation element are adapted to move cooperatively in response to changes in ambient temperature, such that the active microactuator can be maintained in a predefined spatial or positional relationship over a broad range of ambient temperatures in the absence of active alteration of the temperature of the active microactuator. As described below, the temperature compensated MEMS structures can be employed in various applications including but not limited to switches, relays, variable capacitors and resistors, valves, moveable mirror structures, and electromagnetic attenuators.

Complimentary Microactuator Structures

A schematic top view of one embodiment of a temperature compensated microelectromechanical structure according to the present invention is shown in FIG. 1. The temperature compensated microelectromechanical structure of this embodiment comprises a microelectronic substrate, an active microactuator, and a temperature compensation microactuator. The microelectronic substrate 10 has a first major surface and serves as a base underlying the MEMS temperature compensated device. Preferably, the microelectronic substrate comprises a semiconductor material, such as silicon, although other suitable substrate materials may be used. The active microactuator 100 is disposed on the first major surface of the microelectronic substrate and is adapted to move in response to thermal actuation. In particular, the active microactuator is adapted to controllably move in response to the cumulative effect of changes in ambient temperature ($\Delta TA$) and active alteration of the temperature ($\Delta T$) of the active microactuator. Typically, the temperature of the active microactuator is actively altered by actively heating the active microactuator, although the active microactuator could also be actively cooled, if so desired. The temperature compensation microactuator 200 is also disposed on the first major surface of the microelectronic substrate and is adapted to move in response to thermal actuation. While the temperature of the temperature compensation microactuator is not generally actively altered, the temperature compensation microactuator is adapted to controllably move in response to the effect of changes in ambient temperature (ΔTA).

According to the present invention, the temperature compensated microactuator and the active microactuator are both adapted to cooperatively move in unison or in tandem in response to changes in ambient temperature to thereby substantially maintain a predefined spatial relationship between the temperature compensation microactuator and the active microactuator over a broad range of ambient temperatures, in the absence of the active alteration of the temperature of the microactuators. A typical commercial semiconductor device operates in ambient temperatures ranging from −40 to 85 degrees Celsius, while a typical mil-spec (military specification) semiconductor device operates in ambient temperatures ranging from −55 to 125 degrees Celsius. Throughout these broad ranges of ambient temperatures, the temperature compensated MEMS structure of the present invention therefore maintains a predefined spatial relationship between the temperature compensation microactuator and the active microactuator in the absence of active alteration of the temperature of the respective microactuators.

As shown schematically in FIG. 1, for example, the active microactuator and the temperature compensation microactuator may be separated by the same separation distance dl at both a relatively cool ambient temperature as shown in solid lines and at a relatively hot ambient temperature as shown in dashed lines since both microactuators are adapted to move in unison in response to changes in the ambient temperature. Upon actively altering the temperature of the active microactuator, however, the active microactuator will move differently than the temperature compensation microactuator and therefore alter the predefined spatial relationship therebetween. As shown schematically in FIG. 1, for example, the active microactuator may move to a position shown in dotted and dashed lines even though the ambient temperature remains relatively cool so as to reduce the separation distance between the microactuators to d2. As will be hereinafter described, portions of the active microactuator and the temperature compensation microactuator can eventually be brought into contact with one another following further active alteration of the temperature of the active microactuator, such as by further active heating the active microactuator, such that the temperature compensation MEMS structure can serve as a relay, a switch or the like. Although not further discussed herein, the temperature compensation microactuator can also be actively heated or cooled. However, separation distance between the microactuators will only be altered based upon the temperature differential between the temperature compensation microactuator and the active microactuator since changes in temperature that affect both microactuators equally will cause both microactuators to move equally such that the separation distance remains substantially constant.

According to the present invention, the active microactuators and the respective temperature compensation elements, such as the respective temperature compensation microactuators, may be disposed in a variety of predefined spatial relationships with respect to each other. For instance, the active microactuator and temperature compensation element may be disposed parallel to, perpendicular to, or in any other orientation with respect to the first major surface of the microelectronic substrate. Further, the active microactuator and temperature compensation element may be disposed within the same plane, in separate planes parallel to the first major surface of the substrate, or in other predefined positional relationships with respect to each other. However, in one advantageous embodiment that will be further described herein below, both the temperature compensation microactuator and the active microactuator are adapted to move within respective planes that extend generally parallel to the first major surface of the microelectronic substrate in response to thermal actuation.

In one embodiment of the present invention, the temperature compensation microactuator comprises a first member adapted to move in response to changes in ambient temperature. Likewise, the active microactuator comprises a second member adapted to move in response to the cumulative effect of changes in ambient temperature and active alteration of the temperature of the active microactuator. According to the present invention, the active microactuator and the temperature compensation microactuator move in unison in response to changes in ambient temperature so as to maintain a predefined spatial relationship, such as a predefined gap for example, between the first and second members in the absence of active alteration of the temperature of the active microactuator. However, the first member and the second member can be selectively brought into contact with each other in response to the active alteration of the temperature of the active microactuator. Thus, these MEMS structures provide members that can controllably and predictably move in response to thermal actuation over a broad ambient temperature range.

Figure 2:
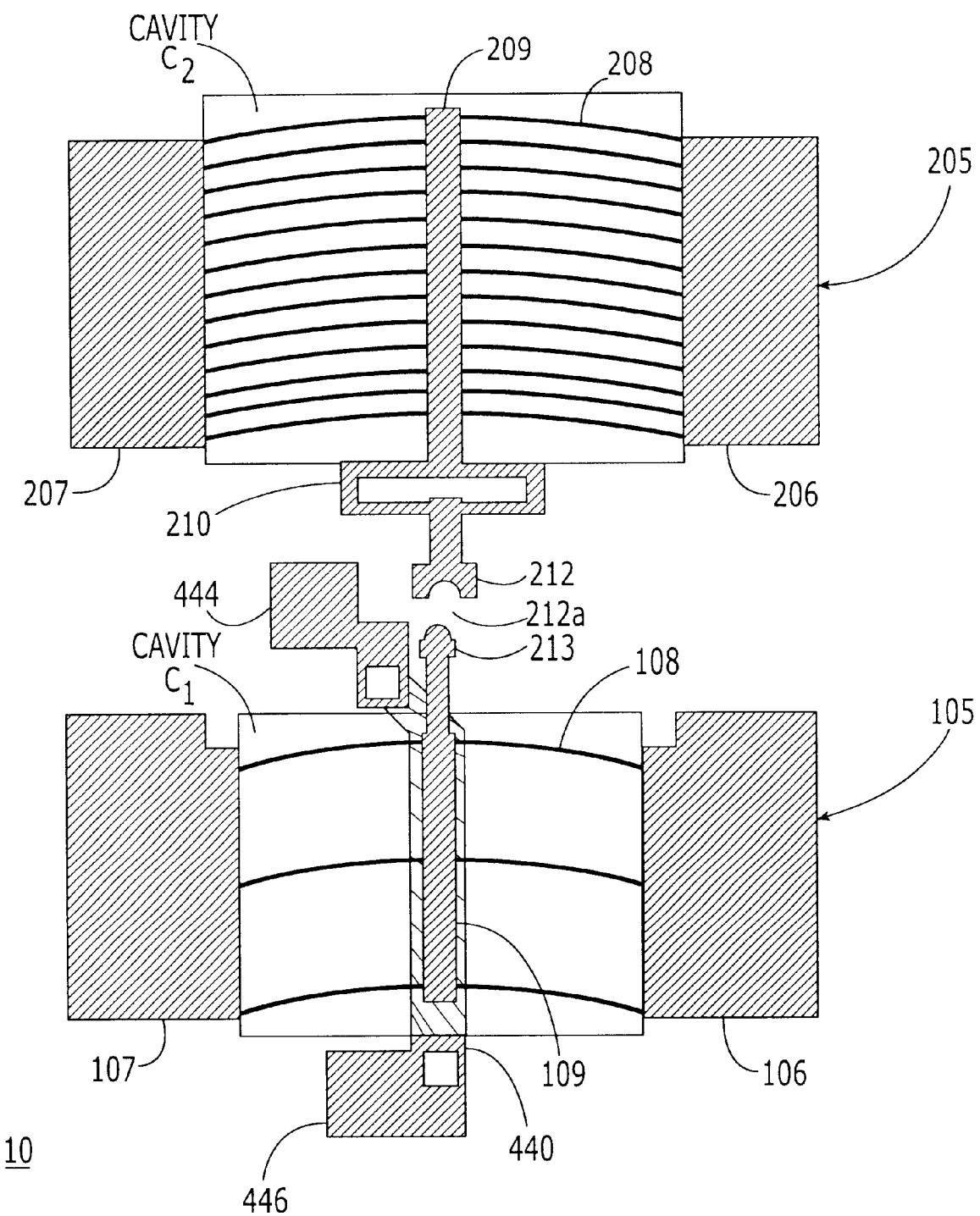
FIG. 2 provides a plan view of a temperature compensated MEMS structure according to one embodiment of the present invention.

One embodiment of a MEMS structure according to the present invention having moveable members is illustrated by the example shown in FIG. 2. As described above in conjunction with FIG. 1, the MEMS structure includes a substrate 10, a temperature compensation microactuator 205 and an active microactuator 105. Both the temperature compensation microactuator and the active microactuator are mounted upon or affixed to the first major surface of the substrate so as to have a predefined spatial relationship therebetween over a broad range of ambient temperatures in the absence of active alteration of the temperature of the active microactuator. The active microactuator and temperature compensation microactuator can comprise any thermally driven actuator. In addition, while the active microactuator and the temperature compensation microactuator can be different types of thermally driven actuators, the active microactuator and the temperature compensation microactuator are generally the same type of actuator. For example, one or, more preferably, both microactuators can comprise thermal arched beam (TAB) actuators as described in U.S. patent application Ser. No. 08/767,192, now U.S. Pat. No. 5,909,078, issued Jun. 1, 1999, the contents of which have been incorporated by reference herein.

Each thermal arched beam actuator comprises at least two anchors affixed to the first major surface of the microelectronic substrate. Each thermal arched beam actuator includes at least one arched beam disposed between said at least two anchors and spaced from the substrate such that the arched beam can move relative to the substrate. For instance, an active microactuator 105 includes at least one arched beam 108 disposed between anchors 106 and 107, while the temperature compensation microactuator 205 includes at least arched beam 208 disposed between anchors 206 and 207. While the anchors within each thermal arched beam actuator are affixed to the substrate surface, the arched beams must be released from the microelectronic substrate in order to move freely and efficiently. Typically, a cavity is formed in the microelectronic substrate underlying the moving parts within a microactuator, using established microengineering techniques. A cavity is not required for any active or temperature compensation microactuator. However, since a cavity serves to make an active microactuator more efficient in operation, a cavity is preferably disposed underlying the active microactuator. Optionally, a cavity may be disposed underlying a temperature compensation microactuator. For instance, cavity c1 underlies the arched beams 108 and coupler 109 disposed between anchors 106 and 107 within active microactuator 105. Also, as shown cavity c2 underlies the arched beams 208 and coupler 209 disposed between anchors 206 and 207 within active microactuator 205.

As described in U.S. patent application Ser. No. 08/936,598, the anchors and the arched beams can be constructed from a conductive metal, such as electroplated nickel. Alternatively, the anchors and the arched beams may be constructed from a semiconductor material, such as silicon, or any other material having a suitable thermal coefficient of expansion such that the arched beams expand or contract in a predictable and an appreciable manner in response to changes in temperature. Typically, an arched beam is formed from a material with a positive coefficient of thermal expansion that expands with increases in temperature. However, the arched beam can also be formed from a material having a negative coefficient of thermal expansion that contracts as temperature increases.

Absent active temperature alteration in a quiescent state, each arched beam has a corresponding position and spatial relationship with respect to the microelectronic substrate. For the example shown in FIG. 2, arched beam 108 within active microactuator 105 will arch a preselected amount and assume a corresponding non-actuated position at a given quiescent ambient temperature. Consequently, male mating surface 213 will have a predefined spatial spatial relationship with respect to complimentary female mating surface 212 and to microelectronic substrate 10 when arched beam 108 assumes a quiescent position. This occurs because male mating surface 213 is adapted to move with arched beam 108 through coupler 109, and will be positioned accordingly. From a quiescent position, an arched beam within a thermal arched beam actuator is adapted to move in response to thermal actuation.

For a thermal arched beam having a positive coefficient of thermal expansion, increases in the ambient temperature and/or active heating of the temperature of an arched beam will cause the thermal arched beam to arch further in the same direction in which the arched beam is already arched, such that the arched beam moves with respect to the microelectronic substrate. For instance, as shown in FIG. 2, arched beam 108 within active microactuator 105 will arch further in response to heating thermal actuation so as to move male mating surface 213 closer to the complimentary female mating surface 212. Alternatively, decreases in the ambient temperature and/or active cooling of the temperature of an arched beam having a positive coefficient of thermal expansion will reduce the amount that the thermal arched beam is arched. As shown in FIG. 2, arched beam 108 within active microactuator 105 will arch less in response to cooling thermal actuation so as to move male mating surface 213 farther away from the complimentary female mating surface 212. Once thermal actuation is no longer applied to an arched beam, the arched beam moves in the opposite sense and reassumes the initial position and degree of arching associated with the quiescent thermally non-actuated state.

As described, thermal actuation can be created by ambient temperature changes or by active alteration of the temperature of a microactuator. Further, ambient temperatures can increase or decrease in relation to the ambient temperature corresponding to the quiescent state. While the temperature of the temperature compensation microactuator is not generally actively altered, at least one and, more preferably, each arched beam of the temperature compensation microactuator is adapted to further arch in response to ambient temperature increases. In contrast, at least one and, more preferably, each arched beam of the active microactuator is preferably adapted to further arch in response to the cumulative effect of increases in ambient temperature and the active alteration of the temperature of the active microactuator. Similarly, generally at least one and, more preferably, each arched beam of the temperature compensation microactuator is adapted to arch to a lesser degree in response to ambient temperature decreases. Correspondingly, at least one and, more preferably, each arched beam of the active microactuator is preferably adapted to arch to a lesser degree in response to the cumulative effect of decreases in ambient temperature and the active alteration of the temperature of the active microactuator.

Accordingly, the active and temperature compensation microactuators are both adapted to respond to changes in ambient temperature and compensate therefor, thus maintaining the quiescent state position and spatial relationships. Many techniques may be used to adapt the active and temperature compensation microactuators to move in a predetermined manner in response to changes in ambient temperature. Microactuators can be constructed from materials having different thermal coefficients of expansion. If thermal arched beam actuators comprise the respective microactuators, the length or width of beams can differ between the active and temperature compensation microactuators. In addition, many techniques may be used to adapt the active and temperature compensation microactuators to generate a predetermined amount of force when thermally actuated by active or ambient temperature variations. Preferably, the respective microactuators can have a different number of similarly constructed arched beams. For instance, the temperature compensated microactuator can have a larger number of arched beams than the corresponding active microactuator. Differences in the number of arched beams within a thermal arched beam microactuator can be used to control the relative amounts of force generated therein. Those skilled in the art will understand that other techniques not mentioned here may be used to tailor the characteristics of the respective microactuators in response to temperature variations from any source.

In order to actively alter the temperature of the active microactuator, the active microactuator preferably includes means for heating one or more of the arched beams either directly or indirectly. Although a wide variety of techniques can be utilized to heat the arched beams as described in U.S. patent application No. 08/767,192, now U.S. Pat. No. 5,909,078, issued Jun. 1, 1999 and U.S. patent application Ser. No. 08/936,598, now U.S. Pat. No. 5,994,816, issued Nov. 30, 1999, the means for heating may include means for passing electrical current through one or more of the arched beams in order to directly heat the arched beams. For example, a voltage differential can be applied between the supports such that current flows through the arched beams, thereby heating the arched beams and causing further arching. Alternatively, the means for heating can include an external heater, such as a polysilicon heater that is disposed upon the substrate so as to underlie at least portions of the arched beams. By passing current through the external heater, the external heater will radiate heat that, in turn, will warm the arched beams, thereby indirectly heating the arched beams and causing further arching. For instance, active microactuator 105 includes heater 440 disposed to heat arched beam 108, as shown in FIG. 2. Also, heater 442 shown in FIG. 3(*a*) serves to heat at least one arched beam within active microactuator 110.

To support an external heater, the substrate generally defines a cavity that opens through the first surface and that underlies at least a portion of the arched beams. As before, the cavity is not required for any microactuator, may be used with any microactuator, and is preferably included in active microactuators. This cavity is preferably formed to increase the efficiency of arched beams within a thermal arched beam actuator from the underlying microelectronic substrate. For instance, cavity c1 underlying arched beam 108 within active microactuator 105 in FIG. 2, and cavity c3 underlying the arched beams within active microactuator 110 in FIG. 3(*a*) can be constructed in this manner. While the opposed ends of the external heater are disposed upon the first surface of the substrate, the medial portions of the external heater preferably extend over the cavity so as to be spaced from both the substrate and the arched beams. While the external heater can be serpentine in shape as shown in U.S. patent application Ser. No. 08/767,192, now U.S. Pat. No. 5,909, 078, issued Jun. 1, 1999 and U.S. patent application Ser. No. 08/936,598, now U.S. Pat. No. 5,994,816, issued Nov. 30, 1999, the external heater can have a relatively linear shape as shown in FIG. 2. In this embodiment, the external heater 440 extends across the cavity and underlies medial portions of the arched beams in order to heat the beams and to cause further arching. As shown, the opposed ends of the external heater are disposed on the first surface of the substrate on opposite sides of the cavity c1. In addition, contact pads 444 and 446 can be defined upon the first surface of the substrate in electrical contact with the opposed ends of the external heater such that current can directed through the external heater by applying a voltage differential between the contact pads.

While the active microactuator has been described hereinabove as including means for heating the arched beams, the active microactuator could, instead, include other means for actively altering the temperature of the arched beams. For example, the active microactuator can include a cooling device for cooling the arched beams in order to reduce the arching of the beams.

For the embodiment shown in FIG. 2, each microactuator also includes a member, such as a coupler, that interconnects each thermal arched beam. For example, coupler 109 in the active microactuator interconnects three beams, while coupler 209 in the temperature compensation microactuator interconnects thirteen beams. Each coupler is adapted to move accordingly in response to thermal actuation of the arched beams connected thereto. Thus, a coupler serves to combine the forces created by the movement of each thermal arched beam in response to thermal actuation. The couplers of the active and temperature compensation microactuators can provide complimentary mating surfaces. For instance, a temperature compensated MEMS structure can have male and female mating surfaces with various configurations as shown in FIGS. 2 and 3(*a*). More particularly, the embodiment of FIG. 2 includes an active microactuator 105 having a coupler with a male mating surface 213 and a temperature compensation microactuator 205 having a coupler with a complimentary female mating surface 212.

According to the present invention, the active microactuator and the temperature compensation microactuator maintain the same predefined spatial relationship over a range of ambient temperatures in the absence of active alteration of the temperature of the microactuators. This predefined spatial relationship is perhaps best illustrated by the corresponding predefined spatial relationship that is maintained between the corresponding mating surfaces. With reference to the embodiment of FIG. 2, for example, the active microactuator and the temperature compensation microactuator maintain a predefined spatial relationship, i.e., a predefined gap, between the corresponding mating surfaces of the respective microactuators over a range of ambient temperatures in the absence of active alteration of the temperature of the microactuators.

Once the arched beams of the active microactuator are heated or the temperature of the arched beams are otherwise actively altered, the active microactuator will move differently that the temperature compensation microactuator such that the microactuators will no longer maintain the predefined spatial relationship, i.e., the predefined gap, between the corresponding mating surfaces. With reference to the embodiment of FIG. 2, for example, actively heating arched beam 108 of the active microactuator will move the male mating surface of the active microactuator toward the female mating surface of the temperature compensation microactuator, thereby decreasing the predefined gap between the corresponding mating surfaces of the respective microactuators. With sufficient heating of the arched beams of the active microactuator, the male mating surface of the active microactuator can be moved into contact with the female mating surface of the temperature compensation microactuator.

The microactuators may also include a spring adapted to flex and absorb mechanical stresses. For instance, mechanical stresses can develop when the couplers affixed to different microactuators move and selectively contact one another or when a pair of microactuators that are latched attempt to pull apart, such as upon removal of the active heating of one of the microactuators. For the example in FIG. 2, the temperature compensated MEMS structure includes a temperature compensation microactuator having a spring 210 that is adapted to flex when subjected to forces, such as upon contact of the respective couplers. The spring may be formed of various materials having suitable strength and flexibility such as silicon or a conductive metal. While the spring can have various configurations, the spring of the embodiment shown in FIG. 2 is a generally rectangular loop that is connected to the coupler proximate the respective mating surface. Alternatively, the embodiment shown in FIG. 3(*a*) has a generally C-shaped member that serves a spring function by flexing to permit the rectangular-shaped member to be inserted into the C-shaped member, moved and supported therein, and optionally removed therefrom.

The temperature compensated MEMS structures of the present invention can be employed in a variety of applications. For example, the temperature compensated MEMS structure can include mating electrical contacts carried by the temperature compensation microactuator and the active microactuator in order to form a relay, a switch or the like. Typically, the electrical contacts are fabricated from electroplated nickel that is overplated with a conductive material, as described below, in order to provide high conductivity and reliability while delivering excellent resistance to oxidation. In addition, overplating can be used to define the minimum interstructure spacing between mating parts. In operation, the male electrical contact and the complimentary female electrical contact can be selectively brought into contact with each other or, alternatively, separated from one another in response to the active alteration of the temperature of active microactuator depending upon whether the contacts are normally open or normally closed, respectively, in the absence of the active alteration of the temperature of the active microactuator.

One embodiment of a temperature compensated MEMS structure having mating male and female contacts is shown in FIG. 2. In this embodiment, the active microactuator 105 includes a male mating surface 213 disposed upon the end of the coupler 109 nearest the temperature compensation microactuator. The male mating surface of this embodiment is coated with a conductive material, such as gold, to serve as a male electrical contact. Likewise, the temperature compensation microactuator includes a complimentary female mating surface 212 disposed upon the end of the coupler 209 nearest the active microactuator. The female mating surface is also coated with a conductive material, such as gold, to serve as a female electrical contact. In operation, when the active microactuator is actively heated, the respective contacts are brought into contact and an electrical connection is created therebetween. In embodiments in which the microactuators are formed of electroplated nickel, the microactuators are also conductive such that the electrical connection between the contact surfaces also effectively electrically connects the microactuators as well as the respective circuits that are connected to the microactuators as described in U.S. patent application Ser. Nos. 08/767,192 and 08/936,598. In other embodiments in which the microactuators are formed of silicon, conductive traces can be formed from the electrical contacts to respective contact pads, typically disposed upon a respective anchor, which, in turn, may be connected to an electrical circuit. Once the active heating of the active microactuator is removed, however, the electrical contacts are again separated by the predefined gap which is maintained substantially constant over a wide range of ambient temperatures since the active microactuator and the temperature compensation microactuator move in unison in response to fluctuations in the ambient temperature.

Figure 3A:
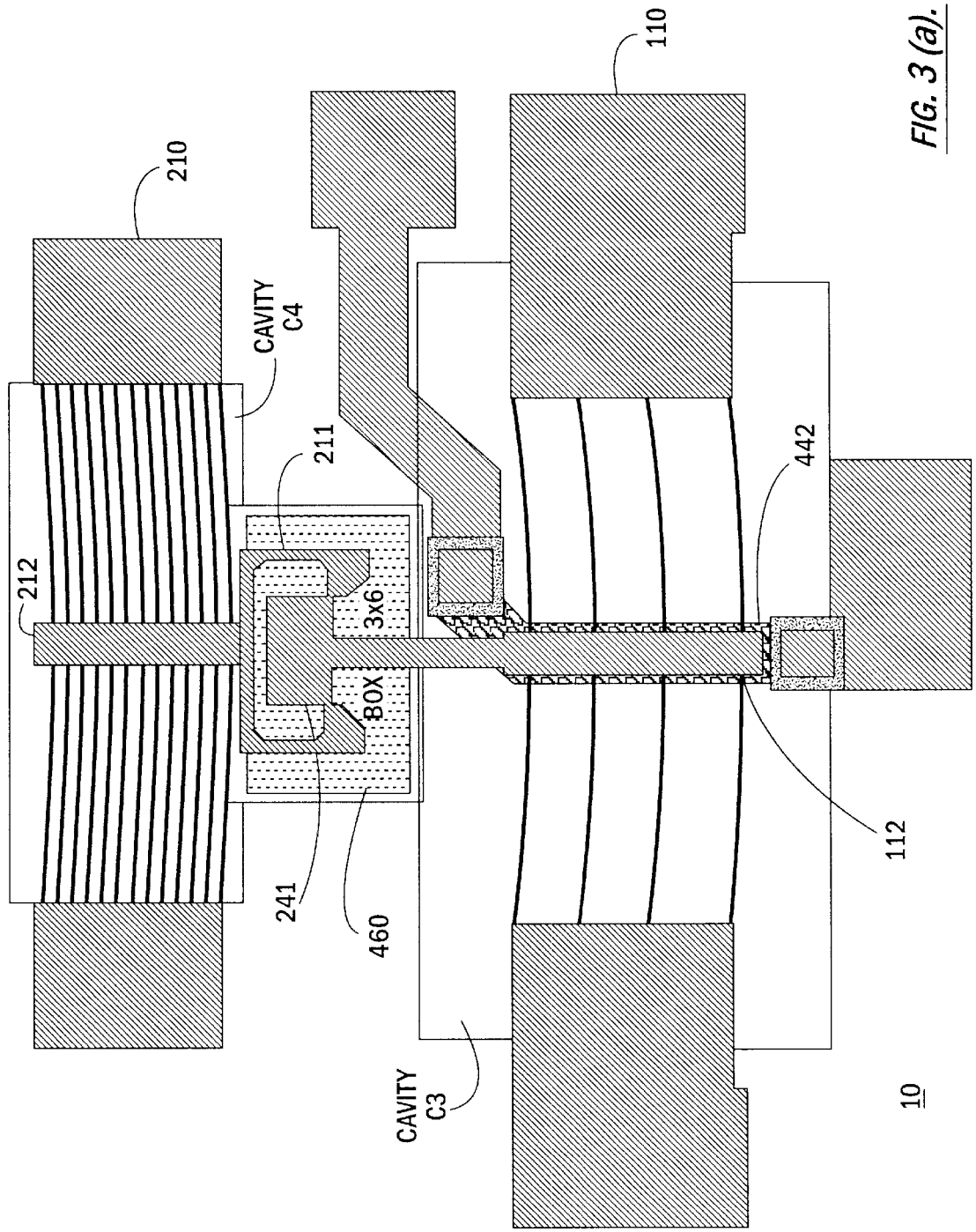
FIG. 3(a) provides a plan view of a temperature compensated MEMS structure according to another embodiment of the present invention, while FIGS. 3(b) and 3(c) provide fragmentary plan views of the male and female mating surfaces of the temperature compensated MEMS structure of FIG. 3(a) in the closed and open positions, respectively.
Figure 3:
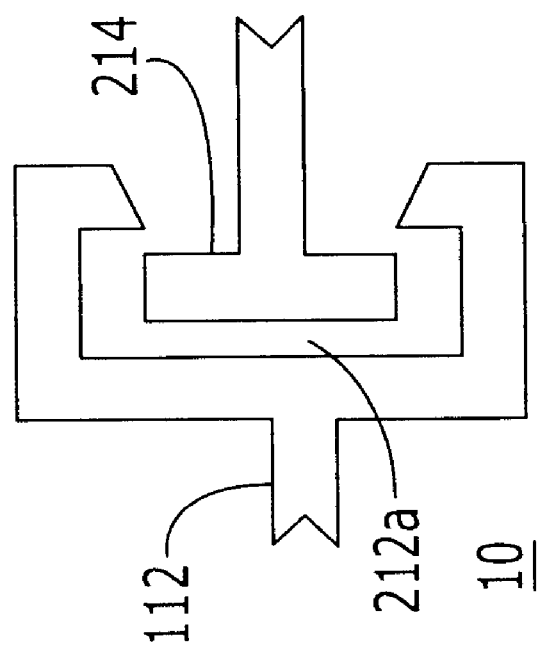
Figure 3:
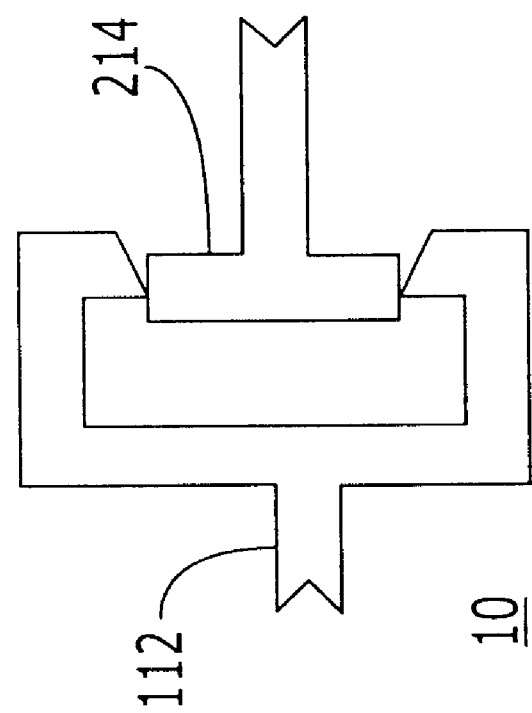

An alternative embodiment of a temperature compensated MEMS structure having male and female electrical contacts is depicted in FIG. 3(a). In this embodiment, the temperature compensation microactuator 210 comprises a coupler 212 which has a generally C-shaped member 211 proximate one end thereof. As shown, the C-shaped member provides a female mating surface that is coated with a conductive material, such as gold. The active microactuator 110 of this embodiment also comprises a coupler 112 that has a plunger 241 proximate one end thereof. The plunger provides the male mating surface and is also coated with a conductive material, such as gold.

In operation, the plunger can be at least partially inserted into the C-shaped member. In one embodiment, the plunger is in contact with the edges of the C-shaped member proximate the opening as shown in FIG. 3(b) in instances in which the microactuators are subject only to ambient conditions and are not actively heated or cooled. Once the active microactuator is actively heated, however, the plunger is moved into a center portion of the C-shaped member as shown in FIG. 3(c) so as to no longer contact the C-shaped member. As such, the temperature compensated MEMS structure of this embodiment makes contact between the respective conductive mating surfaces in the absence of active heating of the active microactuator while separating the conductive mating surfaces in instances in which the active microactuator is actively heated. Alternatively, the plunger as shown in FIG. 3(c) may be selectively thermally actuated so as to controllably contact the interior of the C-shaped member, for instance at the solid portion proximate the reference numeral 112 or at the opening of the C-shaped member. In addition, the plunger shown in FIG. 3(b) may be selectively thermally actuated so as to controllably contact the exterior of the C-shaped member proximate to the opening. Those skilled in the art will appreciate that many other embodiments are possible wherein the plunger and C-shaped member are adapted to controllably contact each other in a variety of configurations, whether or not the temperature of the active microactuator is varied.

According to either embodiment, the configuration of the mating surfaces preferably provides for a controlled sliding contact motion between the plunger and the C-shaped member. This sliding contact provides advantages for cleaning impurities that may build up on the contact surfaces due to the wiping action of the contacts. In this regard, the application of an overplating of a conductive material, such as gold, rhodium, or other suitable elements known to form good electrical contacts upon nickel mating structures serves to provide better contact resistance and wear characteristics.

As previously mentioned, the C-shaped member also functions as a spring 211 by flexing to permit the plunger to be inserted therein. In addition, the C-shaped member has a flared opening adapted to guide the plunger into the interior of the C-shaped member. While the plunger and the C-shaped member are generally designed such that the plunger can be inserted into and removed from the C-shaped member during normal operation. Optionally, the C-shaped member may be adapted to controllably latch the plunger in place inside the C-shaped member.

As described above, many MEMS structures define a gap in at least one operative position. In this regard, MEMS relays, switches or the like, including the embodiments of FIGS. 2 and 3, define a gap between a pair of electrical contacts in instances in which the MEMS relay, switch or the like is in an open position. As will be described in more detail hereinbelow, MEMS capacitors can similarly define a separation gap between the conductive plates that form the capacitor.

In order to further improve the performance and reliability of these MEMS structures, the size of the gap defined by the MEMS structures is advantageously defined with even greater levels of precision. In this regard, the various gaps defined by conventional MEMS structures have been typically subject to minimum interstructure spacings in the range of approximately 5 microns or less. While this range is suitable for many MEMS applications, evolving MEMS applications will demand reduced minimum interstructure spacings and increased precision in order to obtain greater performance from the resulting MEMS device.

Figure 4:
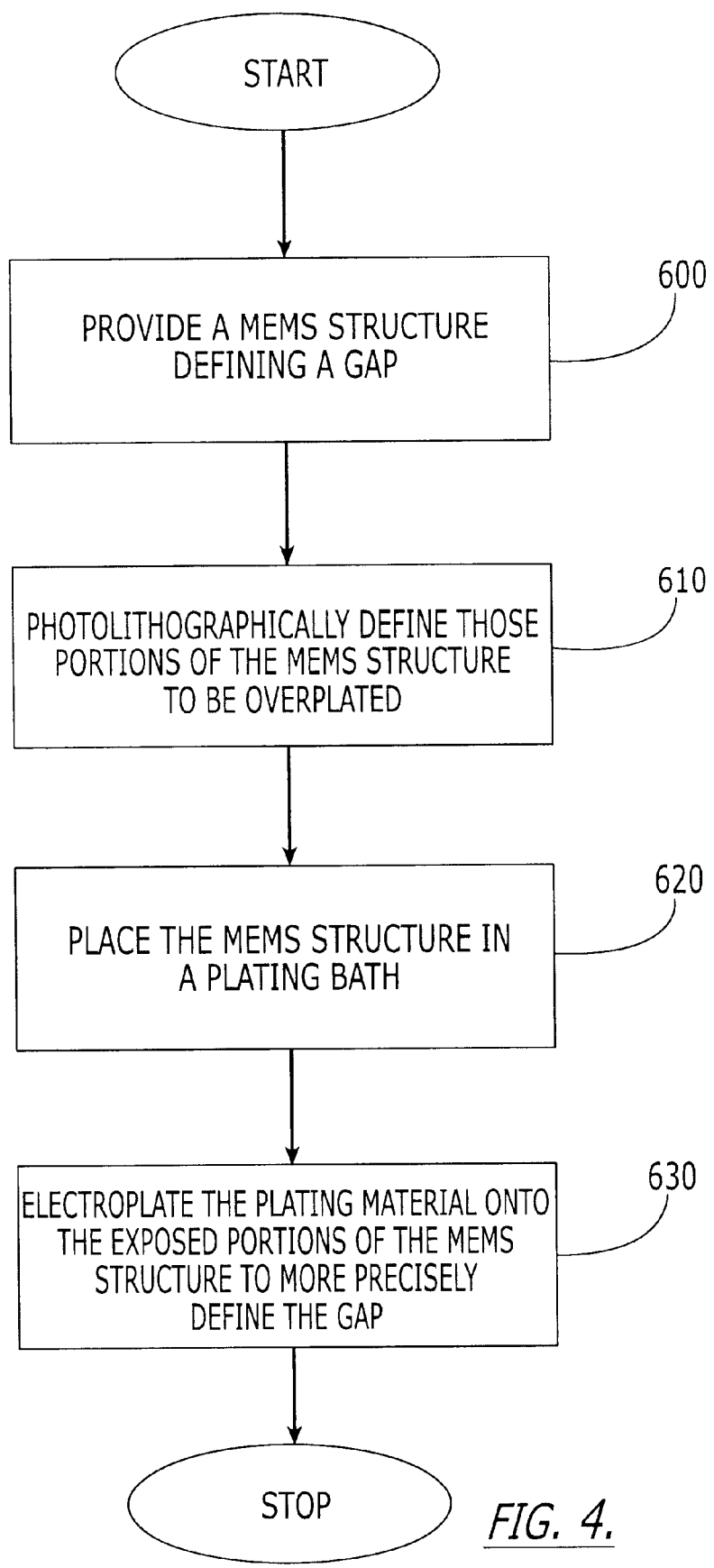
FIG. 4 is a flow chart illustrating the operations performed to overplate at least a portion of a MEMS structure according to one embodiment of the present invention.

As such, the present invention also provides an advantageous technique for overplating surfaces of a MEMS structure in order to more precisely size a gap that is defined by the MEMS structure. As shown in blocks 600 and 610 of FIG. 4, those portions of the MEMS structure that will be overplated are photolithographically defined. Typically, a layer of photoresist is deposited over the surface of the MEMS structure and a window is thereafter opened to expose those portions of the MEMS structure that define the gap and that are to be overplated. The MEMS structure is then placed in a plating bath that includes a plating material. See block 620. The plating material is generally a conductive material, such as gold, rhodium, silver, rhuthenium, palladium or other elements known to form good electrical contact, as well as alloys thereof. The plating material is then electroplated onto the exposed portions of the MEMS structure, including those portions of the MEMS structure that define the gap. See block 630.

The electroplating process is controlled such that the resulting gap defined by the electroplated portions of the MEMS structure has a predefined size. In this regard, the gap gradually decreases in size as additional plating material is electroplated onto the exposed portions of the MEMS structure. By controlling the amount of plating material that is electroplated onto the exposed portions of the MEMS structure by controlling the rate of deposition and the duration of the electroplating process, however, the size of the resulting gap defined by the MEMS structure can be precisely defined. In particular, the gap defined by the overplated portions of a MEMS structure can be precisely defined to within approximately 0.5 microns. As such, the resulting MEMS structure should have improved performance characteristics relative to MEMS devices having less well defined gaps.

A variety of MEMS structures can be overplated. For example, MEMS structures having at least two contacts that define a contact separation gap, such as those shown in FIGS. 2 and 3, can be electroplated by overplating the plating material onto the contacts such that the resulting contact separation gap has a predetermined size. Similarly, a MEMS capacitor, as described hereinbelow, that has at least two conductive plates and that defines a separation gap can be electroplated such that the plating material is overplated onto the conductive plates in order to create a separation gap having a predefined size. While the overplating process described above is particularly advantageous for MEMS relays, switches, variable capacitors and the like, the overplating process can also be utilized in conjunction with a wide variety of other MEMS structures that define gaps that advantageously have a predefined size.

By way of example, the male and female contacts of the MEMS relay of FIG. 3(*a*) can be overplated, such as with gold, rhodium, silver, rhuthenium, palladium, or other elements known to form good electrical contacts, as well as alloys thereof, in order to more precisely define the contact separation gap between the male and female contacts in the open position. In order to photolithographically define those portions of the MEMS relays that will be overplated, the surface of the MEMS relay is initially coated with photoresist. Thereafter, a window is opened that exposes the male and female contacts and that defines the region to be overplated. For purposes of illustration, FIG. 3(*a*) depicts the region 460 to be overplated by speckled shading. The MEMS structure is then placed in a commercially available plating bath, for example such as those that can typically be purchased by those skilled in the art. The exposed portions of the MEMS relay are then electroplated by passing an appropriate amount of electric current through the plating bath, according to the instructions provided by the manufacturer of the plating bath. Under these conditions, the plating material is typically deposited upon the exposed portions of the MEMS relay at a plating rate of approximately 6 microns/hour. Of course, those skilled in the art will appreciate that many other plating rates may be used while carrying out this aspect of the present invention. The electroplating process can be temporarily halted prior to completion in order to visually inspect the MEMS structure and to determine how much more plating material should be deposited in order to properly size the gap. Based upon the rate at which the plating material is deposited, the MEMS structure can be reinserted into the plating bath and the electroplating process can be resumed for a period of time in order to complete the plating process. Once a number of MEMS structures have been overplated and the electroplating process, including the rate at which the plating material is deposited, has been well characterized, subsequent MEMS structures may be overplated by electroplating the MEMS structures for a predetermined period of time without having to temporarily halt the electroplating process so as to visually inspect the MEMS structure. After removing the current from the plating bath, the overplated MEMS structure is removed from the plating bath and is washed in water or some other suitable solvent. The photoresist layer is then removed from the remainder of the MEMS structure. As such, the resulting MEMS structure can define a gap having a size defined to be within approximately 0.5 microns. Since the gap can be much more precisely defined than the gaps of conventional MEMS structures, the overplated MEMS structures of the present invention correspondingly have improved performance characteristics.

Figure 7:
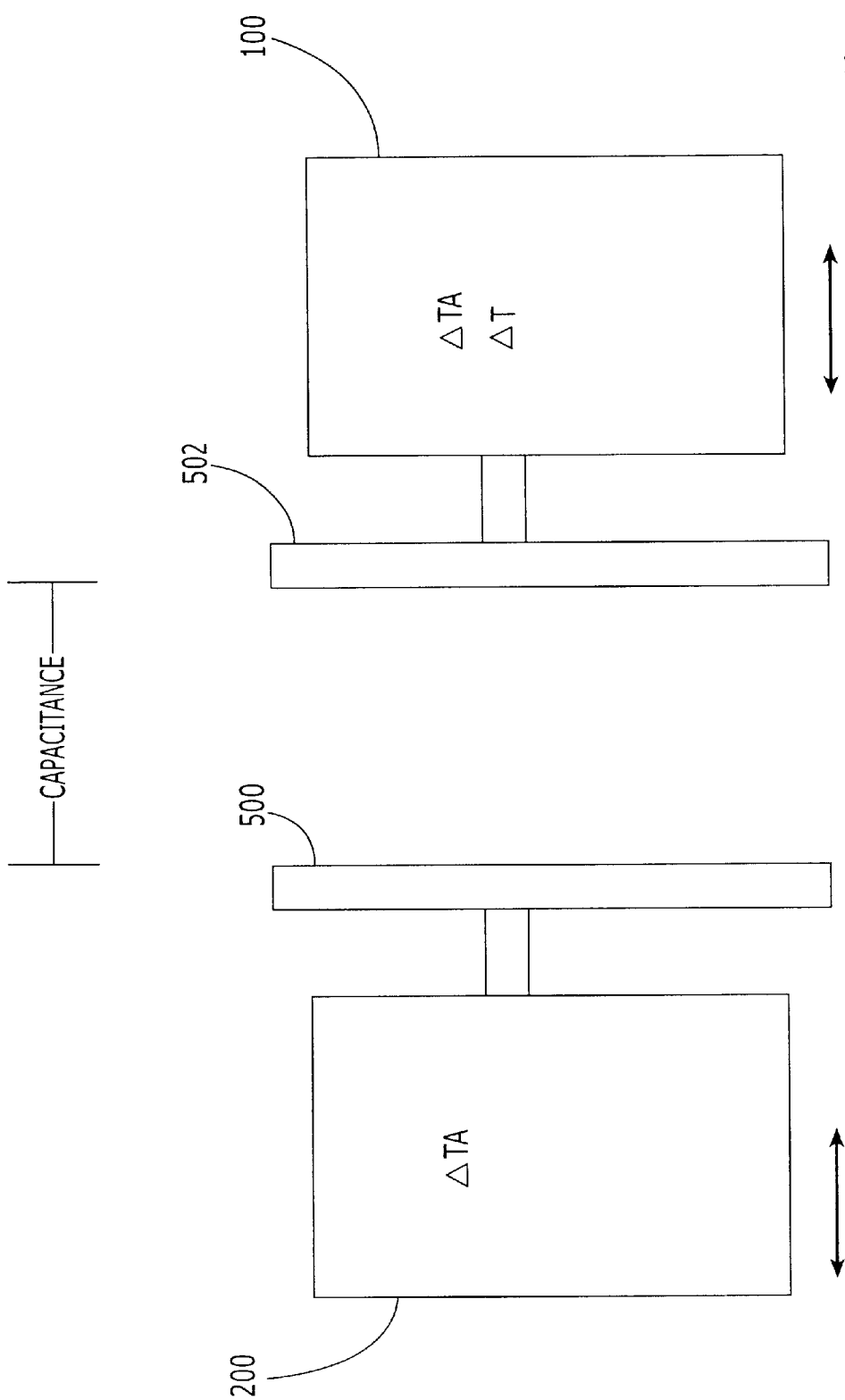
FIG. 7 provides a schematic plan view of another embodiment of a temperature compensated MEMS structure according to the present invention that provides conductive surfaces and operates as a variable capacitor.

The temperature compensated MEMS structures of the present invention can be employed in a wide variety of applications in addition to relays, switches and the like. In particular, the temperature compensated MEMS structure can be employed as a variable capacitor. In this embodiment of the present invention, the temperature compensation microactuator includes a first electrically conductive surface. A variable capacitor can be constructed from the complimentary microactuator structure embodiments or the active microactuator and frame embodiments according to the present invention. For example, as shown in FIG. 7, the temperature compensation microactuator 200 can include a first electrically conductive plate 500 that is connected to the end of the coupler nearest the active microactuator. Likewise, the active microactuator can include a complimentary second electrically conductive surface. For example, the active microactuator 100 can include a second electrically conductive plate 502 that is connected to the end of the coupler nearest the temperature compensation microactuator.

The temperature compensated MEMS structure of this embodiment is designed such that a predefined spatial relationship is maintained between the respective electrically conductive surfaces over a range of ambient temperatures in the absence of active alteration of the temperature of the actuators. As such, the first and second electrically conductive surfaces form a capacitor having a predetermined electrical capacitance that is substantially maintained constant over the range of ambient temperatures in the absence of active alteration of the temperature of the microactuators. By actively altering the temperature of the active microactuator, however, the second electrically conductive plate can be moved relative to the first electrically conductive plate in order to controllably vary the spatial relationship between the respective electrically conductive surfaces and to correspondingly alter the electrical capacitance established. Since the capacitance can be controllably varied by selectively moving the active microactuator in response to the active alteration of its temperature, the resulting temperature compensated MEMS structure can serve as a variable capacitor in which the electrical capacitance can be precisely set. The operation of the frame and active microactuator version of the variable capacitor is similar, except that one conductive surface can be disposed either inside or outside the frame and active microactuator structure.

Figure 8:
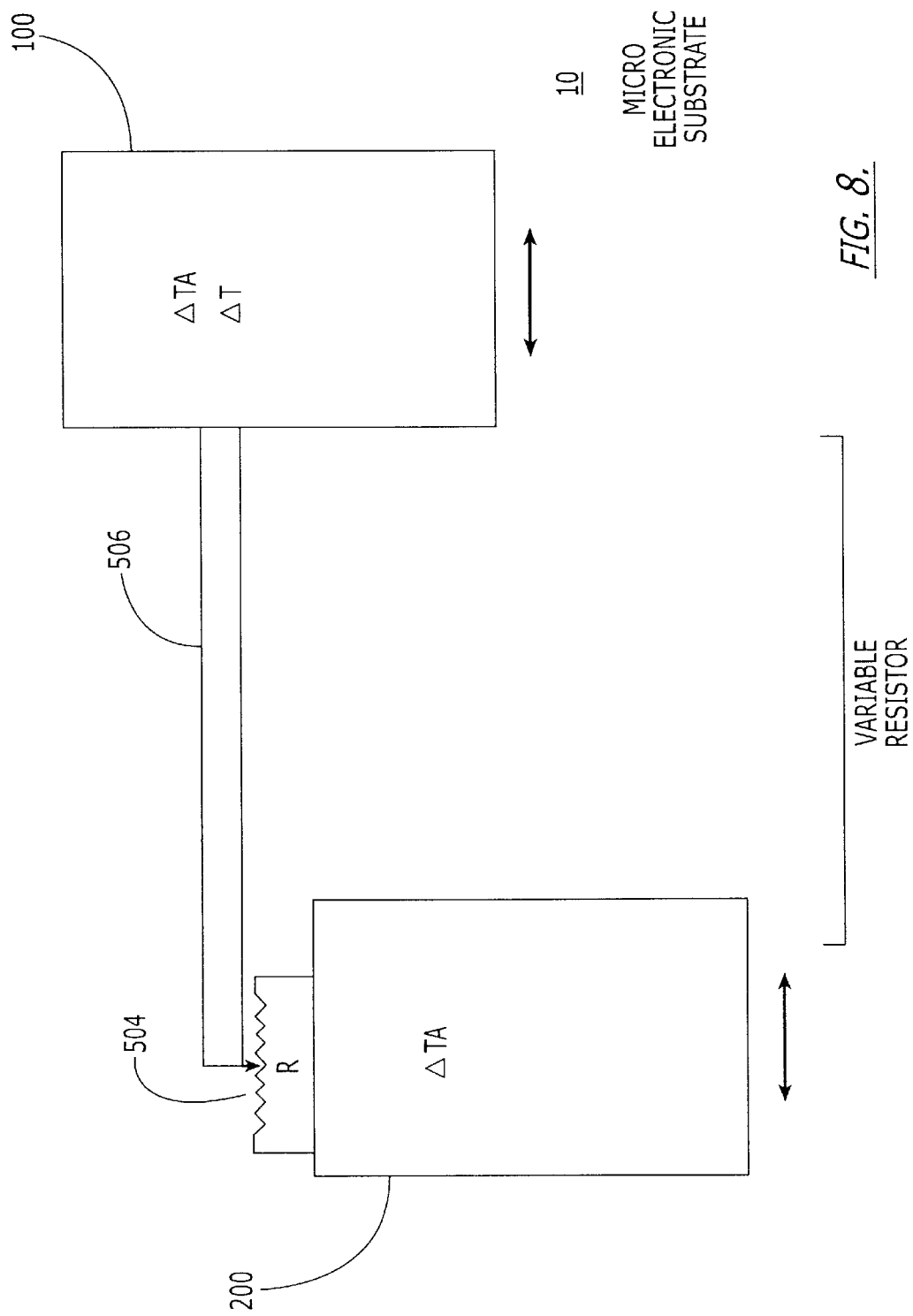
FIG. 8 provides a schematic plan view of another embodiment of a temperature compensated MEMS structure according to the present invention that provides conductive surfaces and operates as a variable resistor.

The temperature compensated MEMS structure of another embodiment can serve as a variable resistor or potentiometer. A variable resistor can be constructed from the complimentary microactuator structure embodiments or the active microactuator and frame embodiments according to the present invention. In this embodiment, the temperature compensation microactuator includes a first electrically conductive member that is typically connected to the end of the coupler nearest the active microactuator. For example, FIG. 8 shows a first electrically conductive member 504 connected to temperature compensation microactuator 200. The active microactuator 100 also includes a second electrically conductive member 506 that is maintained in electrical contact with the first electrically conductive member. The second electrically conductive member of the active microactuator is typically connected to the end of the coupler nearest the temperature compensation microactuator. In the absence of the active alteration of the temperature of the microactuators, the first and second electrically conductive members cooperate to establish a predetermined resistance over a wide range of ambient temperatures.

Upon actively altering the temperature of the active microactuator, however, the second electrically conductive member of the active microactuator is moved relative to the first electrically conductive member such that the second electrically conductive member contacts a different portion of the second electrically conductive member. As a result, the resistance established by the combination of the first and second electrically conductive members is correspondingly altered. Since the resistance can be controllably varied by selectively moving the active microactuator in response to the active alteration of its temperature, the resulting temperature compensated MEMS structure can serve as a variable resistor or potentiometer in which the electrical resistance can be precisely set. The operation of the frame and active microactuator version of the variable resistor is similar, except that either conductive surface can be disposed either inside or outside the frame and active microactuator structure.

Figure 9:
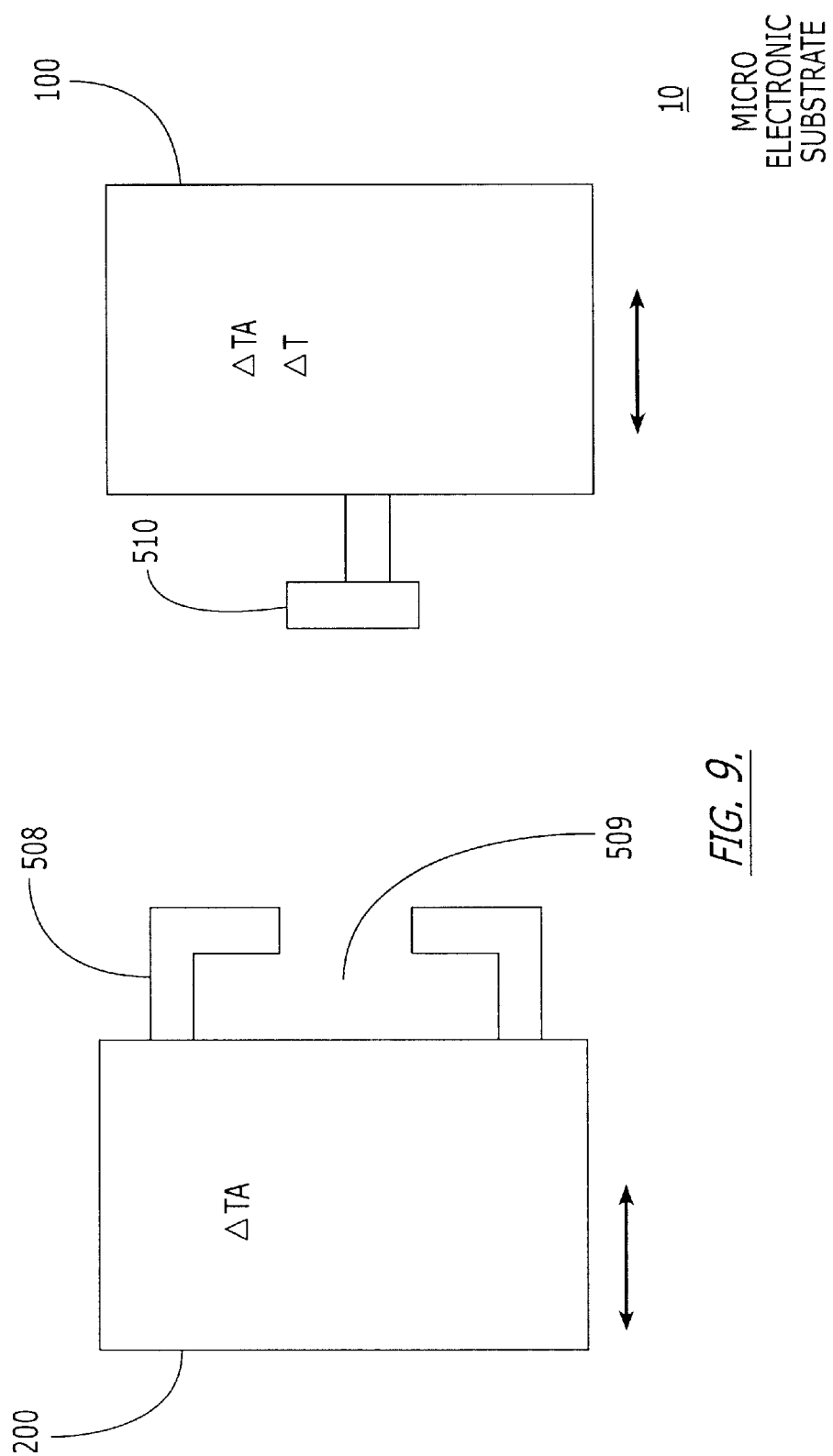
FIG. 9 provides a schematic plan view of another embodiment of a temperature compensated MEMS structure according to the present invention that provides valve plates and operates as a valve.

Other applications of the MEMS temperature compensated structures do not require electrically conductive surfaces or members. In particular, one embodiment of the present invention provides a temperature compensated MEMS valve. A valve can be constructed from the complimentary microactuator structure embodiments or the active microactuator and frame embodiments according to the present invention. As in the other applications of the temperature compensated MEMS structures, temperature compensation is important because the operation of MEMS valves may be adversely impacted in extremely high or extremely low temperature operating temperatures. One example of a MEMS temperature compensated valve is shown in FIG. 9.

The temperature compensated MEMS valve of one embodiment includes a temperature compensation microactuator 200 having a first valve plate 508 with an opening 509 defined therethrough. The first valve plate and opening can be disposed in numerous orientations and spatial relationships with respect to the surface of microelectronic substrate 10. For example, as shown in FIG. 9, the first valve plate and opening may be disposed in a plane that intersects the surface of the microelectronic substrate. Alternatively, the first valve plate and opening may be disposed parallel to the surface of the microelectronic substrate, or in some other planar relationship thereto. While the first valve plate can be mounted in different manners, the first valve plate is typically attached to the end of the coupler nearest the active microactuator. The temperature compensated MEMS valve of this embodiment also includes a complimentary active microactuator 100 having a second valve plate 510, typically attached to the end of the coupler nearest the temperature compensation microactuator, that is adapted to selectively block at least a portion of the opening defined by the first valve plate. For example, in the absence of active alteration of the temperature of the active microactuator, the second valve plate may be positioned so as not to cover any portion of the opening defined by the first valve plate, notwithstanding wide variations in the ambient temperature. By actively altering the temperature of the active microactuator, however, the second valve plate can be controllably positioned so as to at least partially block the opening defined by the first valve plate.

As such, the MEMS valve of this embodiment can precisely open, close, or partially open the opening defined by the first valve plate by actively altering the temperature of the active microactuator without allowing fluctuations in the ambient operating temperatures to affect the relative positions of the first and second valve plates. Although the temperature compensated MEMS valve of the illustrated embodiment is preferably utilized as a light valve, other embodiments of the temperature compensated MEMS valve can selectively pass fluids, gasses or the like. The operation of the frame and active microactuator version of the valve is similar, except that either valve plate structure can be disposed either inside or outside the frame and active microactuator structure.

Frame and Microactuator Structures

Figure 5:
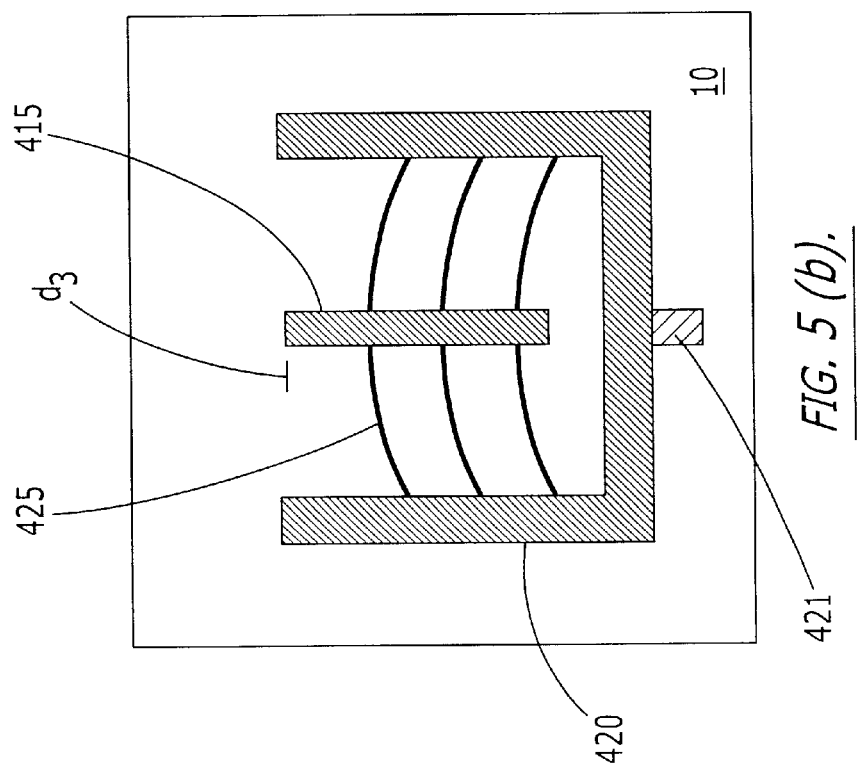
FIGS. 5(a) and 5(b) provide plan views of a temperature compensated MEMS structure according to another embodiment of the present invention at a relative cool temperature and a relatively warm temperature, respectively, while FIG. 5(c) provides a plan view of an temperature compensated MEMS structure according to another embodiment of the present invention that includes direct heating.
Figure 5:
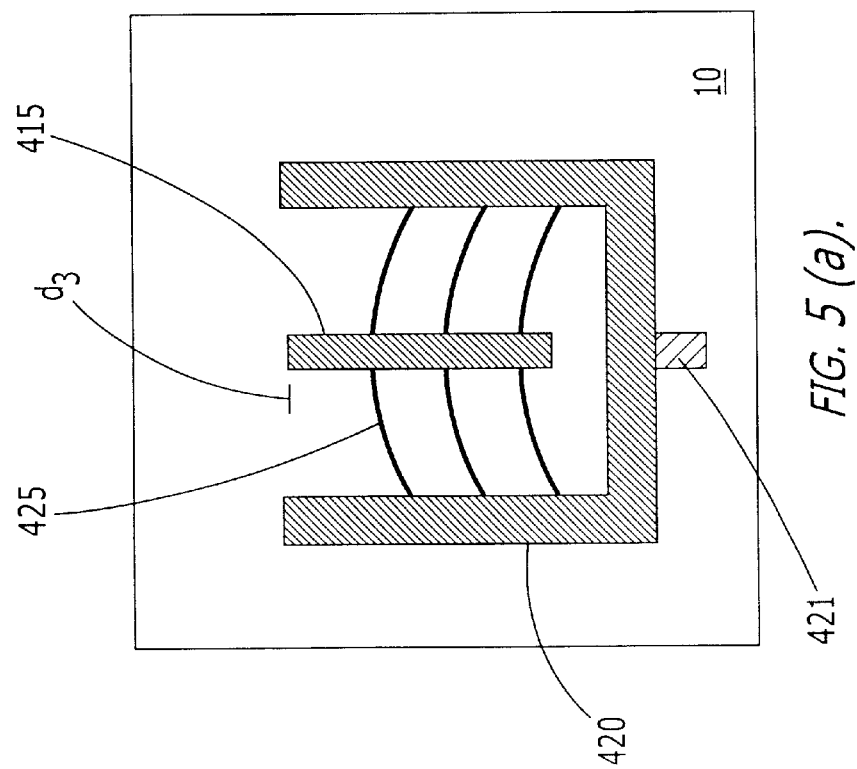
Figure 6:
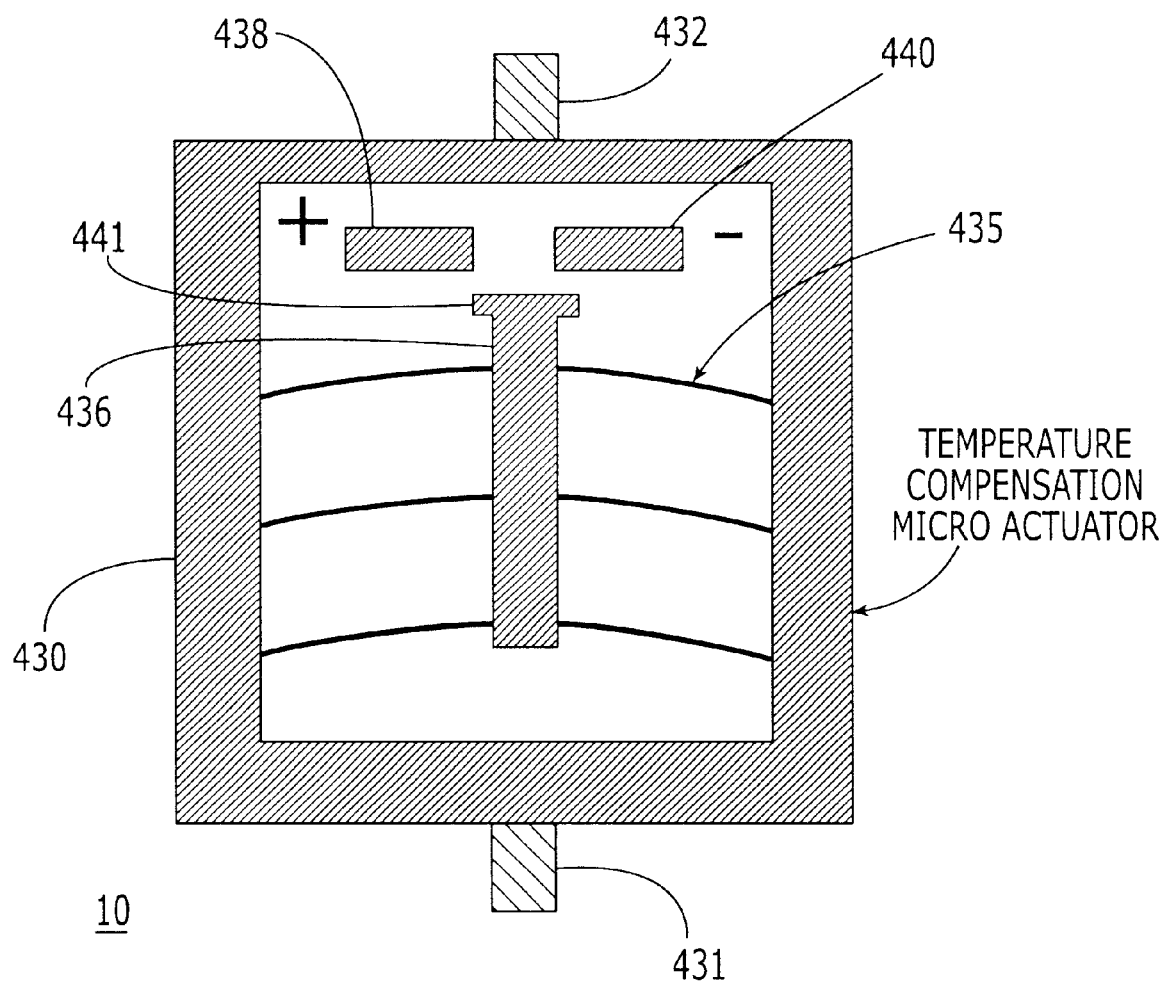
FIG. 6 provides a plan view of another embodiment of a temperature compensated MEMS structure according to the present invention that includes a frame and an active microactuator.

Although the temperature compensated MEMS structures described heretofore have included temperature compensation microactuators, the temperature compensated MEMS structures of the present invention need not include temperature compensation microactuators, but can include other types of temperature compensation elements. As shown in FIGS. 5 and 6, for example, a temperature compensated MEMS structure can include a microelectronic substrate, an active microactuator, and a frame acting as a temperature compensation element.

In this embodiment, the frame and active microactuator overlie the first major surface of microelectronic substrate 10. As before, the microelectronic substrate preferably comprises a semiconductor material, such as silicon. The frame 420 is disposed upon the first major surface and adapted for thermal actuation so as to move in response to changes in ambient temperature ($\Delta TA$). In particular, the frame includes one or more anchors, such as anchor 421 shown in FIG. 5(a), affixed to the substrate with the remainder of the frame being suspended above the substrate by the anchors. In addition, the active microactuator 425 is operably connected to the frame 420 and is adapted to move in response to the active alteration of the temperature ($\Delta T$) of the active microactuator. The frame is adapted to move in response to changes in ambient temperature so as to compensate therefor and support the active microactuator in substantially the same relative position.

The thermally compensated MEMS structure of this embodiment is designed such that in the absence of active alteration of the temperature of the active microactuator, the frame and the active microactuator cooperatively move in response to changes in ambient temperature to thereby substantially maintain at least a portion of the active microactuator in substantially the same relative position with respect to the microelectronic substrate. Although the thermally compensated MEMS structure can be designed such that different portions of the active microactuator are held in position with respect to the substrate, the thermally compensated MEMS structure of the illustrated embodiment maintains the leading end of the coupler of the active microactuator in a fixed position with respect to the substrate in the absence of the active alteration of the temperature of the active microactuator.

In the previous embodiment that included both active and temperature compensation microactuators, the effects of ambient temperature variations were nullified because the respective microactuators both moved so as to cancel the effects of ambient temperature. As such, the active and temperature compensation microactuators need not be connected to each other. However, in the present embodiment that includes a frame and an active microactuator, the effects of ambient temperature variations are canceled because the frame and the active microactuator are operably connected and are designed to expand and contract in response to ambient temperature variations such that at least a portion of the active microactuator remains in a fixed position with respect to the substrate. In this embodiment, the active microactuator 425 has each arched beam disposed within the frame and operably connected thereto, rather than anchored directly to the substrate as with the complimentary microactuator embodiments. As such, the frame can expand or contract in response to ambient temperature variations to accommodate the active microactuator, since the frame and active microactuator are adapted to move in substantially similar proportions. In contrast, when arched beams are affixed at each end to an anchor, the arched beams move significantly more than the anchors in response to variations in temperature. However, in the frame and microactuator embodiments, all portions of the active microactuator will move relative to both the frame and the underlying substrate in response to the active alteration of the temperature of the active microactuator.

Reference is now made to FIGS. 5(a) and 5(b) which illustrate the impact of changes in ambient temperature, in the absence of any active alteration of the temperature of the active microactuator. In FIG. 5(a), the frame 420 and active microactuator 425 are shown in thermal equilibrium at a first ambient temperature with the leading end of the coupler 415 being disposed in a particular position d3 with respect to microelectronic substrate 10. The arched beams of the active microactuator have a given degree of arching or displacement associated with the frame ambient temperature, and the frame has a particular size and shape to accommodate the active microactuator at this ambient temperature. Once ambient temperature changes, the frame 400 and the active microactuator 425 will each change size and shape accordingly. Typically, the frame and active microactuator will expand as temperature rises, and will contract as the temperature drops.

As shown in FIG. 5(b), increases in the ambient temperature will cause the arched beams of the active microactuator 425 to expand or arch further. In response to the increased ambient temperatures, frame 400 will also expand in each direction. As shown, however, the expansion of the frame, particularly in the width direction, offsets or cancels the further arching of the arched beams of the active microactuator such that the leading end of the coupler 415 remains in the same relative position d3 with respect to the microelectronic substrate 10. Once the temperature of the active microactuator is actively altered, however, the leading end of the coupler will be moved relative to the substrate.

Figure 5C:
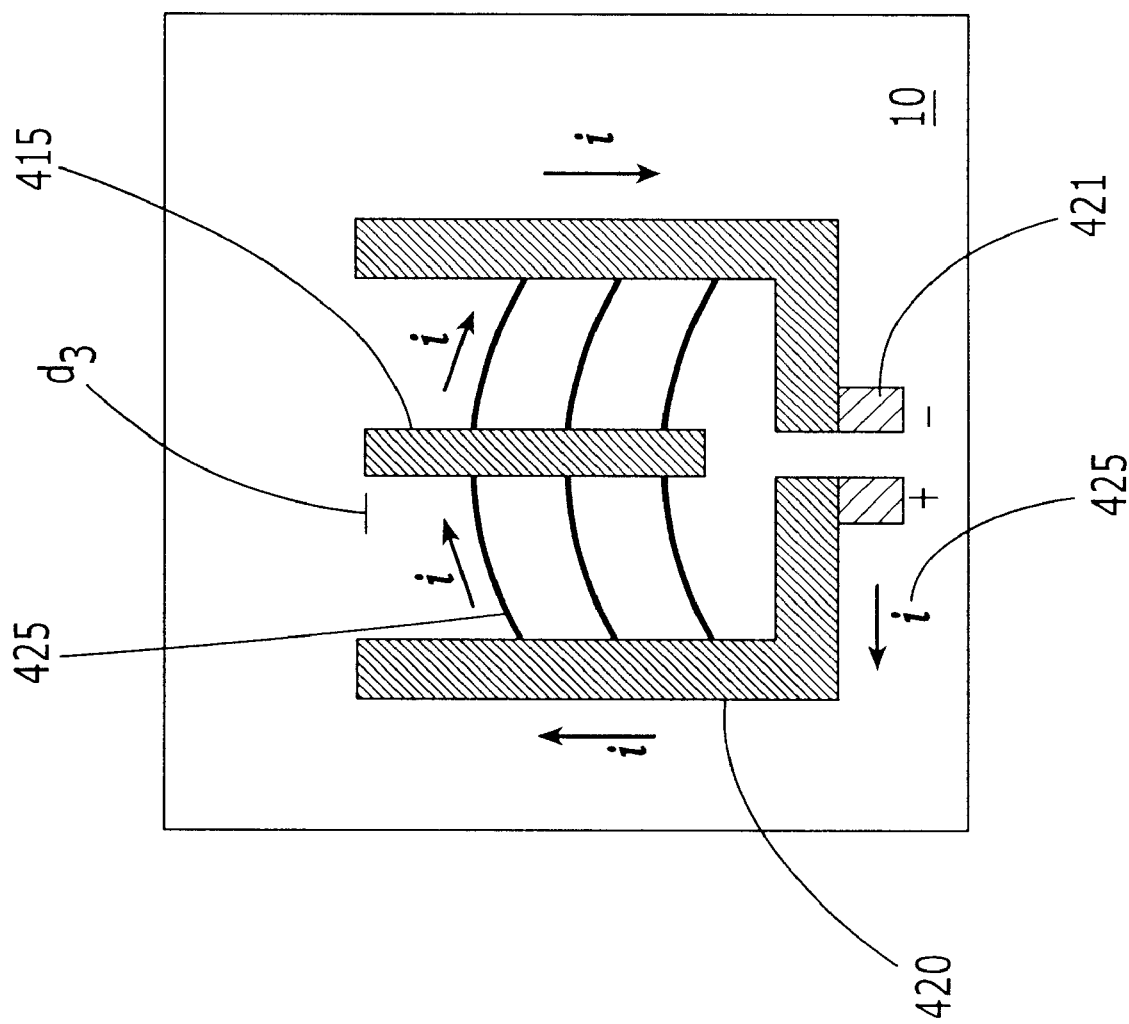

The frame and active microactuator embodiments according to the present invention can use a variety of heaters and heating techniques, as described previously. Further, one example of direct electrical heating as applied to the frame and active microactuator structure embodiments is shown in FIG. 5(c). The frame 420 is separated at the side proximate to the anchors 421. As such, there is electrical isolation between each portion of the separated frame. Further, the anchors can be used as electrical contacts, each anchor connected to a portion of the separated frame. A source of electrical current may be connected between the respective anchors in order to drive electrical current through the frame. For example, electrical current i denoted as 425 can be introduced through the "+" anchor, as shown. The current is conducted through a first portion of the separated frame 420, through at least one arched beam, back through the second portion of the separated frame, and back to the "−" anchor. The cross sectional area of the frame and arched beams can be proportioned so as to create different electrical resistances for the frame and arched beams. In this manner, the arched beams can be controllably heated differently, preferably more, than the separated frame portions. Of course, those skilled in the art understand that this is but one example of the numerous techniques that may be used to directly or indirectly heat the frame and active microactuator structure.

Particular embodiments of the temperature compensated MEMS structure that includes a frame and an active microactuator are depicted in FIGS. 5 and 6. In both embodiments, the frame further comprises at least one anchor affixed to the first major surface of the microelectronic substrate such that the remainder of the frame is suspended above the substrate and capable of moving relative to the substrate. As shown in FIGS. 5(a) and 5(b), for example, a concave frame 420 having a generally C-shape is suspended from a single anchor 421. As such, the active microactuator 425 can be disposed within the frame such that the leading end of the coupler protrudes through the open end of the frame. In an alternative embodiment shown in FIG. 6, the frame 430 includes a pair of anchors 431 and 432 for supporting opposite sides of the generally closed frame that substantially surrounds the active microactuator 435.

As described above in conjunction with the embodiments of the temperature compensated MEMS structures that include both active and temperature compensation microactuators, the temperature compensated MEMS structures that include a frame and an active microactuator can also be employed in various applications, at least some of which will be briefly described herein below. As shown in FIG. 6, the temperature compensated MEMS structure of one embodiment includes at least two electrical contacts 438 and 440 disposed upon the microelectronic substrate 10. The electrical contacts are separated and therefore insulated from each other. The active microactuator and, more particularly, the leading end of the coupler 436 can include a shorting electrical contact 441 that can be moved into contact with the electrical contacts 438 and 440 disposed upon the substrate in response to active alteration of the temperature of the active microactuator, thereby electrically connecting the electrical contacts disposed upon the substrate. As a result of the construction of the temperature compensated MEMS structure, however, the relative position of the shorting electrical contact with respect to the electrical contacts disposed upon the substrate will not be effected by changes in the ambient temperature since changes in the ambient temperature will not move the shorting electrical contact relative to the substrate.

In much the same fashion as described above, the temperature compensated MEMS structures that include a frame and an active microactuator can also serve as variable capacitor and variable resistor structures. The illustration used in FIG. 7 also applies herein, except wherein active microactuator 100 comprises a frame and active microactuator structure for this embodiment, and structures connected to the temperature compensation microactuator 200 are instead disposed upon the microelectronic substrate. In order to form a variable capacitor, the temperature compensated MEMS structure includes a first electrically conductive surface 500 disposed upon the microelectronic substrate. In addition, the active microactuator further comprises a complimentary second electrically conductive surface 502 that is maintained in a predefined spatial relationship with the first electrically conductive surface to thereby establish a predetermined electrical capacitance between the first and second electrically conductive surfaces over a wide range of ambient temperatures in the absence of active alteration of the temperature of the active microactuator. Typically, the second electrically conductive surface is provided by an electrically conductive plate that is operably connected to the coupler, such as the leading end of the coupler. In operation, the capacitance between the first and second electrically conductive surfaces can be controllably varied by actively altering the temperature of the active microactuator which serves to move the second electrically conductive surface relative to the first electrically conductive surface.

Likewise, the temperature compensated MEMS structures that include a frame and an active microactuator can also include electrically conductive members that cooperate to form a variable resistor. The illustration used in FIG. 8 also applies herein, except wherein active microactuator 100 comprises a frame and active microactuator structure for this embodiment, and structure connected to the temperature compensation microactuator 200 are instead disposed upon the microelectronic substrate. In this embodiment, a first electrically conductive member 504 can be disposed upon the microelectronic substrate, while the active microactuator includes a complimentary second electrically conductive member 506 that electrically contacts a portion of the first electrically conductive member. Although not necessary for the practice of the present invention, the second electrically conductive member commonly extends from the leading end of the coupler. As described above, the temperature compensated MEMS structure is designed such that neither electrically conductive member moves in response to changes in ambient temperature, thereby maintaining a constant resistance for current traveling through the conductive members. However, the second electrically conductive member will be moved in response to active alteration of the temperature of the active microactuator such that the resistance for current traveling through the conductive members is correspondingly changed. By actively altering the temperature of the active microactuator in a controlled fashion in order to selectively position the second electrically conductive member relative to the first electrically conductive member, the temperature compensated MEMS structure functions as a variable resistor.

The temperature compensated MEMS structure can also provide a valve to selectively pass light, fluid, gasses or the like. The illustration used in FIG. 9 also applies herein, except wherein active microactuator 100 comprises a frame and active microactuator structure for this embodiment, and structures connected to the temperature compensation microactuator 200 are instead disposed upon the microelectronic substrate. For purposes of illustration, however, a temperature compensated MEMS structure that provides a light valve will be hereinafter described. In this embodiment, the temperature compensated MEMS structure includes a first valve plate 508 disposed upon the substrate. The first valve plate defines a passage 509 therethrough. The active microactuator also includes a second valve plate 510, such as a solid valve plate, that can cooperate with the first valve plate to selectively block at least a portion of the passage in response to active alteration of the temperature of the active microactuator. The first valve plate and passage can be disposed in numerous orientations and spatial relationships with respect to the surface of microelectronic substrate 10. For example, as shown in FIG. 9, the first valve plate and opening may be disposed in a plane that intersects the surface of the microelectronic substrate. Alternatively, the first valve plate and opening may be disposed parallel to the surface of the microelectronic substrate, or in some other planar relationship thereto. Since the second valve plate is attached to that portion of the active microactuator that remains in a fixed position with respect to the substrate as the ambient temperature changes, the valve is immune to fluctuations in the ambient temperature since neither valve plate will change its relative position.

Figure 10:
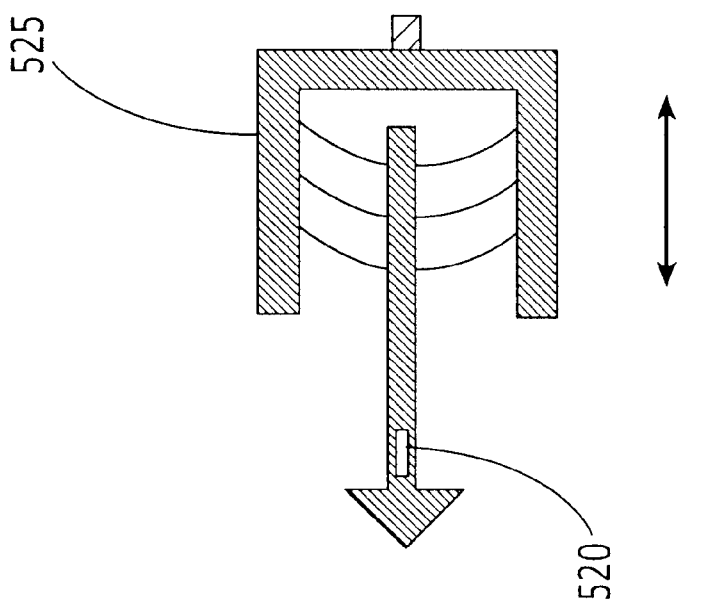
FIG. 10 provides a schematic plan view of another embodiment of a temperature compensated MEMS structure according to the present invention that provides a mirror, attenuator, or the like, moved by an active microactuator.

Another embodiment of a temperature compensated MEMS device of the present invention further includes a mirror, an attenuator of electromagnetic radiation or the like (hereinafter collectively referenced as a mirror) that is adapted for movement with the active microactuator. The mirror, attenuator, and the like may be disposed upon the active microactuator of either the complimentary microactuator or frame and active microactuator structures. Preferably, the mirror is disposed upon an active microactuator within a frame. In particular, for the example shown in FIG. 10, the mirror 520 is mounted upon that portion of the active microactuator 525 that remains in a fixed position with respect to the substrate as the ambient temperature changes such that the relative position of the mirror with respect to the microelectronic substrate is substantially maintained constant over a broad range of ambient temperatures in the absence of active alteration of the temperature of the microactuator. However, the relative position of the mirror is selectively modified by actively altering the temperature of the active microactuator. As such, the mirror can be controllably moved into or out of a beam of light by actively altering the temperature of the active microactuator while preventing changes in the ambient temperature from altering the relative position of the mirror.

As described above, the various embodiments of MEMS temperature compensated structures can therefore be utilized in a wide variety of applications, such as switches, relays, variable capacitors, variable resistors, valves, moveable mirror structures, and electromagnetic attenuators. Those skilled in the art will understand that other applications not mentioned herein may exist for the present invention. As such, the temperature compensated MEMS structures of the present invention can be employed in various applications that demand or prefer moveable structures wherein components are adapted to move in a precise and predictable manner without being adversely effected by variations in ambient temperature or fabrication processes.

In the drawings and specification, there have been disclosed typical preferred embodiments of the present invention and, although specific terms are employed, they are used only in a generic and descriptive sense only and not for purposes of limiting in any respect the scope of the present invention as set forth in the following claims.

That which is claimed:

1. A method of overplating surfaces of a microelectromechanical structure comprising the steps of:

providing a microelectromechanical structure defining a gap between opposing portions of the microelectromechanical structure configured to change in size to provide different operations of the microelectromechanical structure;

placing the microelectromechanical structure in a plating bath that includes a plating material; and electroplating the plating material onto at least the opposing portions of the microelectromechanical structure that define the gap to provide overplated portions of the microelectromechanical structure, said electroplating step comprising controlling the electroplating of the plating material such that the gap defined by the overplated portions of the microelectromechanical structure has a predefined size.

2. A method according to claim 1 further comprising a step of photolithographically defining portions of the microelectromechanical structure to be electroplated prior to placing the microelectromechanical structure in the plating bath.

3. A method according to claim 1 wherein said step of providing a microelectromechanical structure comprises providing a microelectromechanical structure having at least two contacts that define a contact separation gap therebetween, and wherein said electroplating step comprises electroplating the plating material onto the at least two contacts such that the contact separation gap has a predefined size.

4. A method according to claim 1 wherein said step of providing a microelectromechanical structure comprises providing a microelectromechanical structure having at least two conductive plates that define a separation gap therebetween, and wherein said electroplating step comprises electroplating the plating material onto the at least two conductive plates such that the separation gap has a predefined size.

5. A method according to claim 1 wherein said controlling step comprises controlling the electroplating of the plating material such that the gap defined by the overplated portions of the microelectromechanical structure has a size that is defined to within approximately 0.5 microns.

6. A method according to claim 1 wherein the plating material is a conductive material selected from the group consisting of gold, rhodium, silver, rhuthenium, palladium, and alloys thereof, and wherein said electroplating step comprises electroplating the conductive material onto at least portions of the microelectromechanical structure that define the gap.

7. A method according to claim 1 wherein the gap comprises a first gap configured to provide a first operation of the microelectromechanical structure and wherein at least one of the overplated opposing portions of the microelectromechanical structure moves to define a second gap configured to provide a second operation of the microelectromechanical structure.

8. A method of forming a microelectromechanical structure comprising the step of:
electroplating a plating material onto first and second contacts of a microelectromechanical structure to provide first and second overplated contacts of the microelectromechanical structure that define a gap therebetween that is configured to change in response to movement of at least one of the first and second overplated contacts.

9. A method according to claim 8 further comprising the step of:
ceasing electroplating the plating material onto the first and second contacts when the gap is determined to be a predetermined amount.

10. A method according to claim 8 wherein a size of the gap changes as the at least one of the first and second contacts move to provide different operational states for the microelectromechanical structure.

11. A method according to claim 10 wherein a first size of the gap provides an open switch state for the microelectromechanical structure and a second size of the gap, that is less than the first size, provides a closed switch state for the microelectromechanical structure.

12. A method according to claim 10 wherein a first size of the gap provides a first capacitance value for the microelectromechanical structure and a second size of the gap, that is less than the first size, provides a second capacitance value for the microelectromechanical structure.

13. A method of setting a gap between first and second contacts of a microelectromechanical structure at least one of which is moveable comprising:
providing a MEMS structure having the first and second contacts; and
overplating material onto the first and second contacts to narrow the gap to a predefined size.

14. A method according to claim 13 further comprising:
determining that the predefined size of the gap has been achieved by the overplating; and
ceasing overplating the material onto the first and second contacts responsive to the determination that the predefined size has been achieved.

* * * * *